(12) United States Patent
Yamamoto et al.

(10) Patent No.: US 6,424,184 B1
(45) Date of Patent: Jul. 23, 2002

(54) FREQUENCY-VOLTAGE CONVERSION CIRCUIT, DELAY AMOUNT JUDGEMENT CIRCUIT, SYSTEM HAVING FREQUENCY-VOLTAGE CONVERSION CIRCUIT, METHOD OF ADJUSTING INPUT/OUTPUT CHARACTERISTICS OF FREQUENCY-VOLTAGE CONVERSION CIRCUIT, AND APPARATUS FOR AUTOMATICALLY ADJUSTING INPUT

(75) Inventors: Akira Yamamoto, Takatsuki; Shiro Sakiyama, Kadoma; Hiroyuki Nakahira, Katano; Masaru Fukuda, Hirakata; Akira Matsuzawa, Yawata; Shiro Dosho, Ikeda; Shinichi Yamamoto, Hirakata, all of (JP)

(73) Assignee: Matsushita Electric Industrial Co., Ltd., Kadoma (JP)

( * ) Notice: Subject to any disclaimer, the term of this patent is extended or adjusted under 35 U.S.C. 154(b) by 0 days.

(21) Appl. No.: 09/269,315

(22) PCT Filed: Sep. 24, 1997

(86) PCT No.: PCT/JP97/03397

§ 371 (c)(1),
(2), (4) Date: Mar. 24, 1999

(87) PCT Pub. No.: WO98/13742

PCT Pub. Date: Apr. 2, 1998

(30) Foreign Application Priority Data

Sep. 25, 1996 (JP) .............................. 8-252597
Jan. 23, 1997 (JP) .............................. 9-010716
Mar. 24, 1997 (JP) .............................. 9-069610

(51) Int. Cl.[7] ................................ H03D 3/00
(52) U.S. Cl. ................ 327/102; 327/149; 327/158; 327/161
(58) Field of Search ................ 327/102, 101, 327/263, 392, 158, 156, 149, 153, 161; 318/439, 138, 254; 365/233; 357/371

(56) References Cited

U.S. PATENT DOCUMENTS

| 4,760,233 | A | * | 7/1988 | Obara ...................... 219/69 G |
| 4,922,141 | A | * | 5/1990 | Lofgren et al. ............. 327/158 |
| 5,019,756 | A | * | 5/1991 | Schwartz .................... 318/254 |
| 5,118,975 | A | * | 6/1992 | Hillis et al. ................. 327/158 |
| 5,644,203 | A | * | 7/1997 | Naito et al. ................. 318/439 |
| 5,973,525 | A | * | 10/1999 | Fujii .......................... 317/158 |
| 6,049,239 | A | * | 4/2000 | Eto et al. .................... 327/158 |
| 6,125,157 | A | * | 9/2000 | Donnelly et al. ............. 357/71 |
| 6,198,689 | B1 | * | 3/2001 | Yamazaki et al. ........... 365/233 |

FOREIGN PATENT DOCUMENTS

| GB | 2095061 | * | 9/1982 | ................. 327/102 |
| JP | 58-171842 | | 10/1983 | |
| JP | 58-195218 | | 11/1983 | |
| JP | 60-019222 | | 1/1985 | |
| JP | 03-241403 | | 10/1991 | |
| JP | 07-006156 | | 1/1995 | |
| JP | 08-005705 | | 1/1996 | |
| JP | 08211961 | A | 8/1996 | |
| JP | 09270690 | A | 10/1997 | |

OTHER PUBLICATIONS

International Search Report dated Dec. 16, 1997.

* cited by examiner

Primary Examiner—Tuan T. Lam
Assistant Examiner—Hiep Nguyen
(74) Attorney, Agent, or Firm—Renner, Otto, Boisselle & Sklar

(57) ABSTRACT

A frequency-voltage conversion circuit 21 receives a clock CLK as an input and provides a voltage $IV_{dd}$ in accordance with the frequency of the clock as an output. The input and output characteristic of the frequency-voltage conversion circuit 21 is adjusted to substantially match a given input and output characteristic.

39 Claims, 27 Drawing Sheets

K1=High : Voltage IVdd raised
K1=Low  : Voltage IVdd lowered

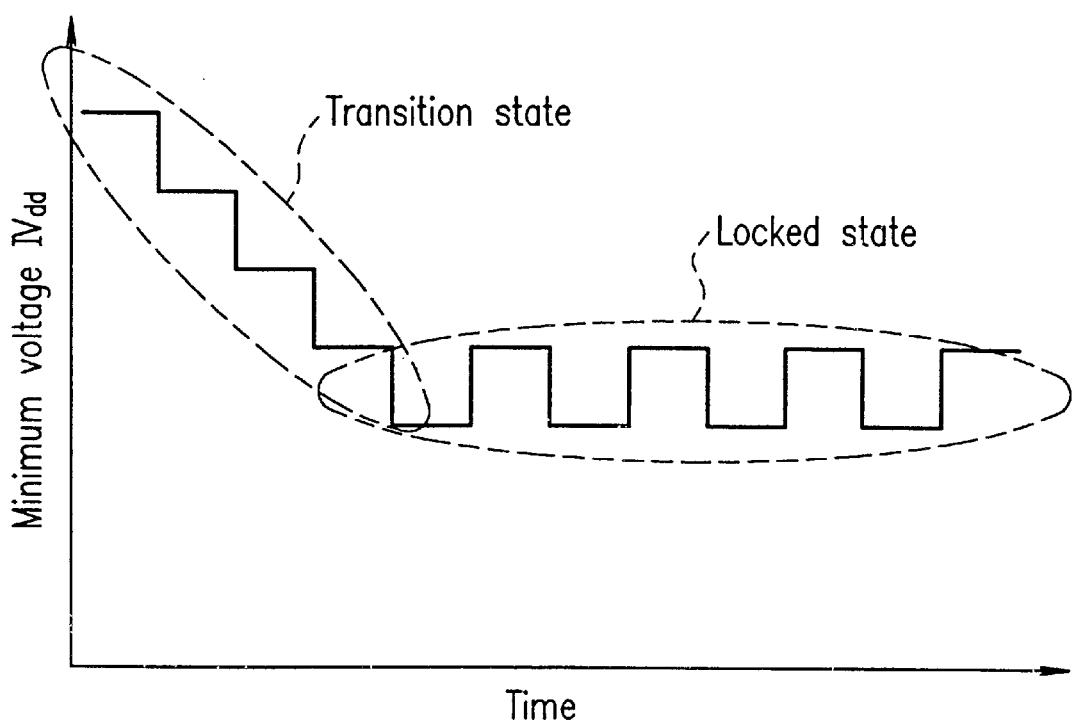

Appropriate locked state

Inappropriate locked state

Transition response

Locked state

FREQUENCY-VOLTAGE CONVERSION CIRCUIT, DELAY AMOUNT JUDGEMENT CIRCUIT, SYSTEM HAVING FREQUENCY-VOLTAGE CONVERSION CIRCUIT, METHOD OF ADJUSTING INPUT/OUTPUT CHARACTERISTICS OF FREQUENCY-VOLTAGE CONVERSION CIRCUIT, AND APPARATUS FOR AUTOMATICALLY ADJUSTING INPUT

TECHNICAL FIELD

The present invention relates to a frequency-voltage conversion circuit and applications thereof, and a delay amount determination circuit.

BACKGROUND ART

Conventionally, in designing a semiconductor integrated circuit (LSI), specifications of the LSI (for example, the minimum power supply voltage, maximum operating frequency and the like of the LSI) have been determined in consideration of the worst conditions for process fluctuations and temperature fluctuations.

In the case where the LSI is operated at a frequency lower than the maximum operating frequency, or in the case where the processing capability of the LSI is changed by the temperature fluctuations, it should be possible to operate the LSI at a voltage lower than the minimum power supply voltage based on the specifications of the LSI. However, the power supply voltage supplied to the LSI has been fixed regardless of the operating environment of the LSI. Accordingly, the power consumption of the LSI has been partially wasted.

One objective of the present invention is to provide an adjustable frequency-voltage conversion circuit adaptable to a characteristic of a target circuit.

Another objective of the present invention is to provide a system including a frequency-voltage conversion circuit for supplying a minimum operating voltage required for the target circuit to normally operate.

Still another objective of the present invention is to provide a method for adjusting an input and output characteristic of the frequency-voltage conversion circuit of the system.

Still another objective of the present invention is to provide an apparatus for automatically adjusting the input and output characteristic of the frequency-voltage conversion circuit of the system.

Still another object of the present invention is to provide a delay amount determination circuit having a simple structure suitable to be used in the frequency-voltage conversion circuit.

DISCLOSURE OF THE INVENTION

A frequency-voltage conversion circuit according to the present invention receives a clock as an input and provides a voltage in accordance with a frequency of the clock as an output. An input and output characteristic of the frequency-voltage conversion circuit is adjustable so as to substantially match a given input and output characteristic. Thus, the above-described objectives are achieved.

The frequency-voltage conversion circuit may be configured to allow a slope and an offset amount of the input and output characteristic of the frequency-voltage conversion circuit to be adjustable.

Another frequency-voltage conversion circuit according to the present invention includes an input pulse signal generation circuit for generating an input pulse signal having a pulse width representing a target delay amount in accordance with a frequency of a clock; a delay circuit for delaying the input pulse signal, the delay circuit outputting a pulse signal obtained by delaying the input pulse signal as an output pulse signal; and a delay amount-voltage conversion circuit for outputting a voltage corresponding to the target delay amount based on a delay amount of the output pulse signal with respect to the input pulse signal and supplying the voltage to the delay circuit. The delay circuit delays the input pulse signal in accordance with the voltage which is output from the delay amount-voltage conversion circuit. Thus, the above-described objectives are achieved.

The input pulse signal generation circuit may intermittently generate the input pulse signals.

A cycle by which the input pulse signals are intermittently generated may be variable.

The input pulse signal generation circuit may stop generation of the input pulse signal in a specific mode.

The delay circuit may be configured to allow a delay time period—power supply voltage characteristic of the delay circuit to be adjustable.

The delay circuit may be configured to allow a slope and an offset amount of a delay time period—power supply voltage characteristic of the delay circuit to be adjustable.

The delay circuit may include a first delay block which operates in accordance with the voltage which is output from the delay amount-voltage conversion circuit. The first delay block may include a plurality of first delay units. A stage number of the first delay units, among the plurality of first delay units through which the input pulse signal passes, may be adjusted in accordance with a first delay control signal.

The delay circuit may further include a second delay block which operates in accordance with a prescribed fixed voltage. The second delay block may include a plurality of second delay units. A stage number of the second delay units, among the plurality of second delay units through which the input pulse signal passes, may be adjusted in accordance with a second delay control signal.

The pulse width of the input pulse signal may be determined as a function of the frequency of the clock.

The function may be represented by $Pw = \alpha/f + \beta$, where $Pw$ is the pulse width of the input pulse signal, $f$ is the frequency of the clock, and $\alpha$ and $\beta$ are constants.

The delay amount-voltage conversion circuit may feedback-control the output voltage so as to increase the output voltage when the delay amount of the output pulse signal with respect to the input pulse signal is larger than the target delay amount and decrease the output voltage when the delay amount of the output pulse signal with respect to the input pulse signal is smaller than the target delay amount.

The delay amount-voltage conversion circuit may include a determination circuit for determining whether or not the delay amount of the output pulse signal with respect to the input pulse signal is larger than the target delay mount and outputting a determination signal indicating the determination result; and a voltage selection circuit for selectively outputting one of a plurality of voltages in accordance with the determination result.

The voltage selection circuit may include a bidirectional shift control circuit for shifting data specifying one voltage to be selected among the plurality of voltages in a direction corresponding to the determination signal; and a switch circuit for selecting one of the plurality of voltages based on the data.

The voltage selection circuit may output the highest voltage among the plurality of voltages as an initial output voltage.

The voltage selection circuit may include a resistor, where one end of the resistor is connected to a high potential, the other end of the resistor is connected to a low potential, and the plurality of voltages are obtained by dividing the resistor.

The voltage selection circuit may further include a switch connected to the resistor in series, and the switch is turned off in a specific mode.

The bidirectional shift control circuit may include a plurality of stages of units, and each of the plurality of stages of units may include a memory circuit storing the data and a 2-input, 1-output selector. An output of the selector included in a specific-stage unit among the plurality of stages of units may be connected to the memory circuit. An input of the selector included in the specific-stage unit among the plurality of stages of units may be connected to the memory circuit included in the unit immediately previous to the specific-stage unit and the memory circuit included in the unit immediately subsequent to the specific-stage unit. The selector included in each of the plurality of stages of units may be controlled by the determination signal.

The bidirectional shift control means may further include means for preventing deletion of the data stored in the memory circuit included in the frontmost-stage unit among the plurality of stages of units; and means for preventing deletion of the data stored in the memory circuit included in the rearmost-stage unit among the plurality of stages of units.

The delay amount-voltage conversion circuit may further include means for storing the output voltage immediately previous to a present output voltage. The delay amount-voltage conversion circuit may output the present voltage as a first output voltage and may output one of the present voltage or the output voltage immediately previous to the present output voltage as a second output voltage. The first output voltage may be supplied to the delay circuit.

The delay amount-voltage conversion circuit may further include means for storing an initial output voltage. The delay amount-voltage conversion circuit may output the present voltage as a first output voltage and may output the initial output voltage as a second output voltage. The first output voltage may be supplied to the delay circuit. The initial output voltage may be updated to the present output voltage when the present output voltage is increased.

A delay amount determination circuit according to the present invention includes an input pulse signal generation circuit for generating an input pulse signal having a pulse width representing a target delay amount; a delay circuit for delaying the input pulse signal, the delay circuit outputting a pulse signal obtained by delaying the input pulse signal as an output pulse signal; and an determination circuit for determining whether or not the delay amount of the output pulse signal with respect to the input pulse signal is larger than the target delay mount and outputting a determination signal indicating the determination result. Thus, the above-described objectives are achieved.

The pulse width of the input signal may be variably adjustable.

The determination circuit may include a data latch circuit receiving the input pulse signal as a clock input and the output pulse signal as a data input, and an output from the data latch circuit may be output as the determination signal.

A system according to the present invention includes a target circuit which operates in accordance with a clock and a power management circuit for supplying a minimum voltage required for the target circuit to be operable in accordance with a frequency of the clock. The power management circuit includes the above-described frequency-voltage conversion circuit. The power management circuit supplies the voltage which is output from the frequency-voltage conversion circuit as the minimum voltage. Thus, the above-described objectives are achieved.

The system may be formed on a single semiconductor chip.

The power management circuit may further include voltage conversion means for converting a given power supply voltage into the voltage which is output from the frequency-voltage conversion circuit, and the power management circuit may provide a target circuit with an output from the voltage conversion means as the minimum voltage.

Another system according to the present invention includes a target circuit which operates in accordance with a clock and a frequency-voltage conversion circuit for receiving the clock as an input and providing a voltage in accordance with a frequency of the clock as an operating voltage for the target circuit, and system being characterized in that an input and output characteristic of the frequency-voltage conversion circuit is adjustable so that the voltage which is output from the frequency-voltage conversion circuit substantially matches a minimum voltage required for the target circuit to be operable at the frequency of the clock. Thus, the above-described objectives are achieved.

The target circuit may have a plurality of different delay time period—power supply voltage characteristics, and the input and output characteristic of the frequency-voltage conversion circuit may be adjusted based on a delay time period—power supply voltage characteristic which is obtained by synthesizing the plurality of different delay time period—power supply voltage characteristics.

The frequency-voltage conversion circuit may have a plurality of delay circuits corresponding to the plurality of different delay time period—power supply voltage characteristics, and each of the plurality of delay circuits may be configured to allow the delay time period—power supply voltage characteristic to be adjustable.

The frequency-voltage conversion circuit may be configured so that a slope and an offset amount of the input and output characteristic of the frequency-voltage conversion circuit are adjustable.

A method according to the present invention is a method for adjusting an input and output characteristic of a frequency-voltage conversion circuit in a system including a target circuit which operates in accordance with a clock and the frequency-voltage conversion circuit for receiving the clock as an input and providing a voltage in accordance with a frequency of the clock as an operating voltage for the target circuit, the method comprising the steps of adjusting a slope of the input and output characteristic of the frequency-voltage conversion circuit based on the operating voltage for the target circuit measured with respect to a plurality of frequencies of the clock; and adjusting an offset amount of the input and output characteristic of the frequency-voltage conversion circuit so that the target circuit is operable within a prescribed frequency range of the clock. Thus, the above-described objectives are achieved.

The frequency-voltage conversion circuit may include an input pulse signal generation circuit for generating an input pulse signal having a pulse width representing a target delay amount in accordance with the frequency of the clock; a delay circuit for delaying the input pulse signal, the delay circuit outputting a pulse signal obtained by delaying the input pulse signal as an output pulse signal; and a delay amount-voltage conversion circuit for outputting a voltage corresponding to the target delay amount based on the amount of the output pulse signal with respect to the input pulse signal and supplying the voltage to the delay circuit; the delay circuit delaying the input pulse signal in accordance with the voltage which is output from the delay amount-voltage conversion circuit. The slope of the input and output characteristic of the frequency-voltage conversion circuit is adjusted by adjusting a slope of a delay time period—power supply voltage characteristic of the delay circuit. The offset amount of the input and output characteristic of the frequency-voltage conversion circuit is adjusted by adjusting an offset amount of the delay time period—power supply voltage characteristic of the delay circuit.

The delay circuit may include a first delay block which operates in accordance with the voltage which is output from the delay amount-voltage conversion circuit and a second delay block which operates in accordance with a prescribed fixed voltage. The first delay block may include a plurality of first delay units. The second delay block may include a plurality of second delay units. A slope of the delay time period—power supply voltage characteristic of the delay circuit may be adjusted by adjusting a stage number of the first delay units, among the plurality of first delay units through which the input pulse signal passes. An offset amount of the delay timer period—power supply voltage characteristic of the delay circuit may be adjusted by adjusting a stage number of the second delay units, among the plurality of second delay units through which the input pulse signal passes.

The frequency-voltage conversion circuit may include an input pulse signal generation circuit for generating an input pulse signal having a pulse width representing a target delay amount in accordance with the frequency of the clock; a delay circuit for delaying the input pulse signal, the delay circuit outputting a pulse signal obtained by delaying the input pulse signal as an output pulse signal; and a delay amount-voltage conversion circuit for outputting a voltage corresponding to the target delay amount based on the delay amount of the output pulse signal with respect to the input pulse signal and supplying the voltage to the delay circuit; the delay circuit delaying the input pulse signal in accordance with the voltage which is output from the delay amount-voltage conversion circuit. The slope and the offset amount of the input and output characteristic of the frequency-voltage conversion circuit may be adjusted by adjusting the pulse width of the input pulse signal as a function of the frequency of the clock.

The function may be represented by $Pw=\alpha/f+\beta$, where Pw is the pulse width of the input pulse signal, f is the frequency of the clock, and $\alpha$ and $\beta$ are constants. The slope of the input and output characteristic of the frequency-voltage conversion circuit may be adjusted by adjusting a value of $\alpha$. The offset amount of the input and output characteristic of the frequency-voltage conversion circuit may be adjusted by adjusting a value of $\beta$.

An apparatus according to the present invention is an apparatus for automatically adjusting an input and output relationship of a frequency-voltage conversion circuit in a system including a target circuit which operates in accordance with a clock and the frequency-voltage conversion circuit for receiving the clock as an input and providing a voltage in accordance with a frequency of the clock as an operating voltage for the target circuit, the apparatus comprising self-diagnosis means for determining whether or not the target circuit normally operates in the relationship between the operating voltage and the frequency of the clock; and adjustment means for adjusting the input and output relationship of the frequency-voltage conversion circuit based on the determination result of the self-diagnosis means. Thus, the above-described objectives are achieved.

The self-diagnosis means may include operating means for operating the target circuit with respect to an input vector for realizing a maximum delay path of the target circuit; and comparison means for comparing an output from the target circuit with respect to the input vector with a prescribed expected value with respect to the input vector.

The adjustment means may include means for adjusting a slope of an input and output characteristic of the frequency-voltage conversion circuit; and means for adjusting an offset amount of the input and output characteristic of the frequency-voltage conversion circuit.

The apparatus and the system may be formed on a single semiconductor chip.

BRIEF DESCRIPTION OF THE DRAWINGS

FIG. 9 is a view showing a change of a minimum voltage $IV_{dd}$ from a transition state to a locked state.

FIG. 13 is a view showing a structure of an improved voltage selection circuit 33a.

FIG. 15A is a view showing a structure of an improved state retaining circuit 334a.

FIG. 18 is a view showing a structure of a delay amount-voltage conversion circuit 30a.

FIG. 25 is a view explaining a method for adjusting the input and output characteristic of the frequency-voltage conversion circuit 21a.

FIG. 27 is a view showing a structure of an apparatus 3 for automatically adjusting the input and output characteristic of the frequency-voltage conversion circuit 21a.

BEST MODE FOR CARRYING OUT THE INVENTION

Hereinafter, the present invention will be described by way of illustrative examples with reference to the accompanying drawings.

EXAMPLE 1

Figure 1:
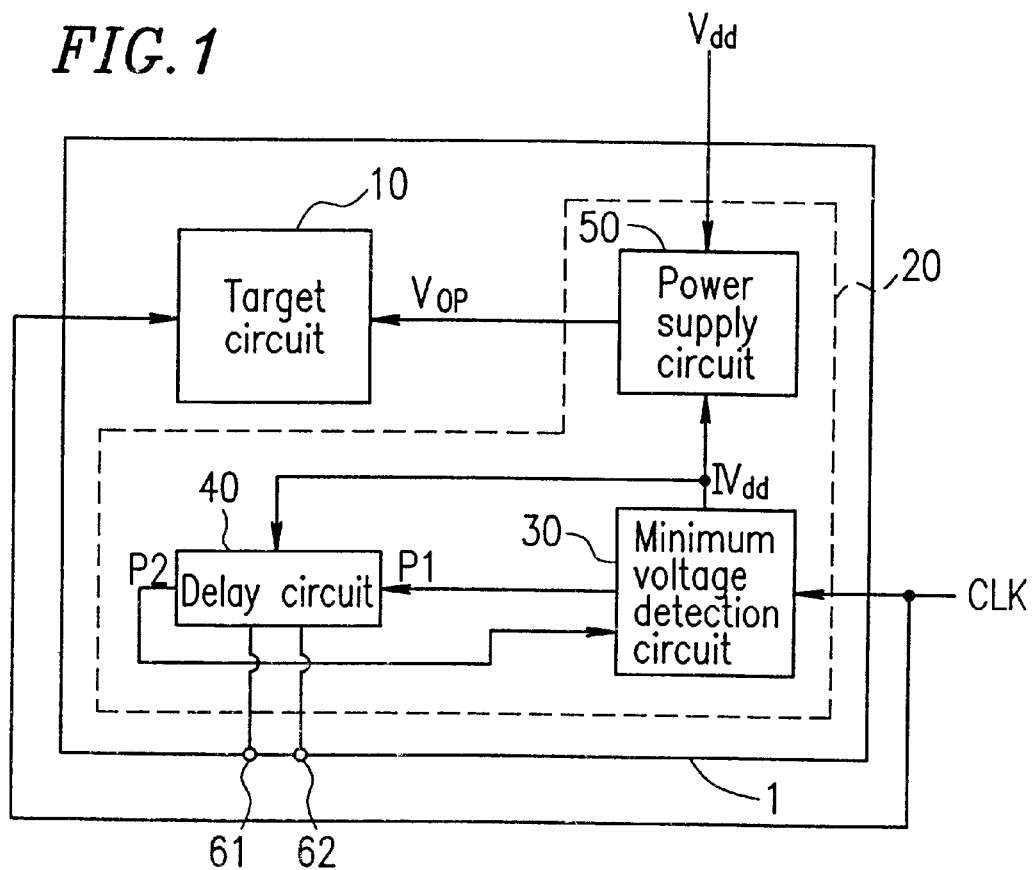
FIG. 1 is a view showing a structure of a system 1 in a first example of the present invention.

FIG. 1 shows a structure of a system 1 in a first example according to the present invention. The system 1 includes a target circuit 10 and a power management circuit 20 for supplying a minimum operating voltage $V_{OP}$ to the target circuit 10 in accordance with the frequency of a clock CLK. The system 1 can be formed on a single semiconductor chip.

The target circuit 10 can be, for example, a digital signal processor (DSP) or a central processing unit (CPU). The target circuit 10 operates in accordance with the clock CLK.

The power management circuit 20 includes a minimum voltage detection circuit 30, a delay circuit 40, and a power supply circuit 50.

The minimum voltage detection circuit 30 controls a minimum voltage $IV_{dd}$ based on the phase difference between an input pulse signal P1 input to the delay circuit 40 and an output pulse signal P2 output from the delay circuit 40. The minimum voltage $IV_{dd}$ is supplied to the delay circuit 40 and the power supply circuit 50.

The input pulse signal P1 is generated by the minimum voltage detection circuit 30 and input to the delay circuit 40. The input pulse signal P1 has a pulse width representing a target delay amount. The target delay amount is determined based on the frequency of the clock CLK. The target delay amount is, for example, the length of one cycle of the clock CLK.

The delay circuit 40 delays the input pulse signal P1. The time length by which the input pulse signal P1 delayed by the delay circuit 40 changes in accordance with the minimum voltage $IV_{dd}$. The input pulse signal P1 delayed by the delay circuit 40 is output to the minimum voltage detection circuit 30 as the output pulse signal P2.

The power supply circuit 50 generates the operating voltage $V_{OP}$ based on the minimum voltage $IV_{dd}$. For example, the power supply circuit 50 can be a voltage converter for converting a power supply voltage $V_{dd}$ to the operating voltage $V_{OP}$ with the minimum voltage $IV_{dd}$ being the target voltage. Such a voltage converter is preferably a DC/DC converter for converting a DC power supply voltage $V_{dd}$ (e.g., 3 V) to a DC operating voltage $V_{OP}$ at a high efficiency (e.g., 95%) in order to reduce the power consumption of the entirety of the power management circuit 20. Alternatively, the power supply circuit 50 can be an operational amplifier.

However, it is not indispensible that the power supply circuit 50 is included in the power management circuit 20. In lieu of generating the operating voltage $V_{OP}$ based on the minimum voltage $IV_{dd}$, the minimum voltage $IV_{dd}$ controlled by the minimum voltage detection circuit 30 can be supplied to the target circuit 10 as the operating voltage $V_{OP}$.

Figure 2:
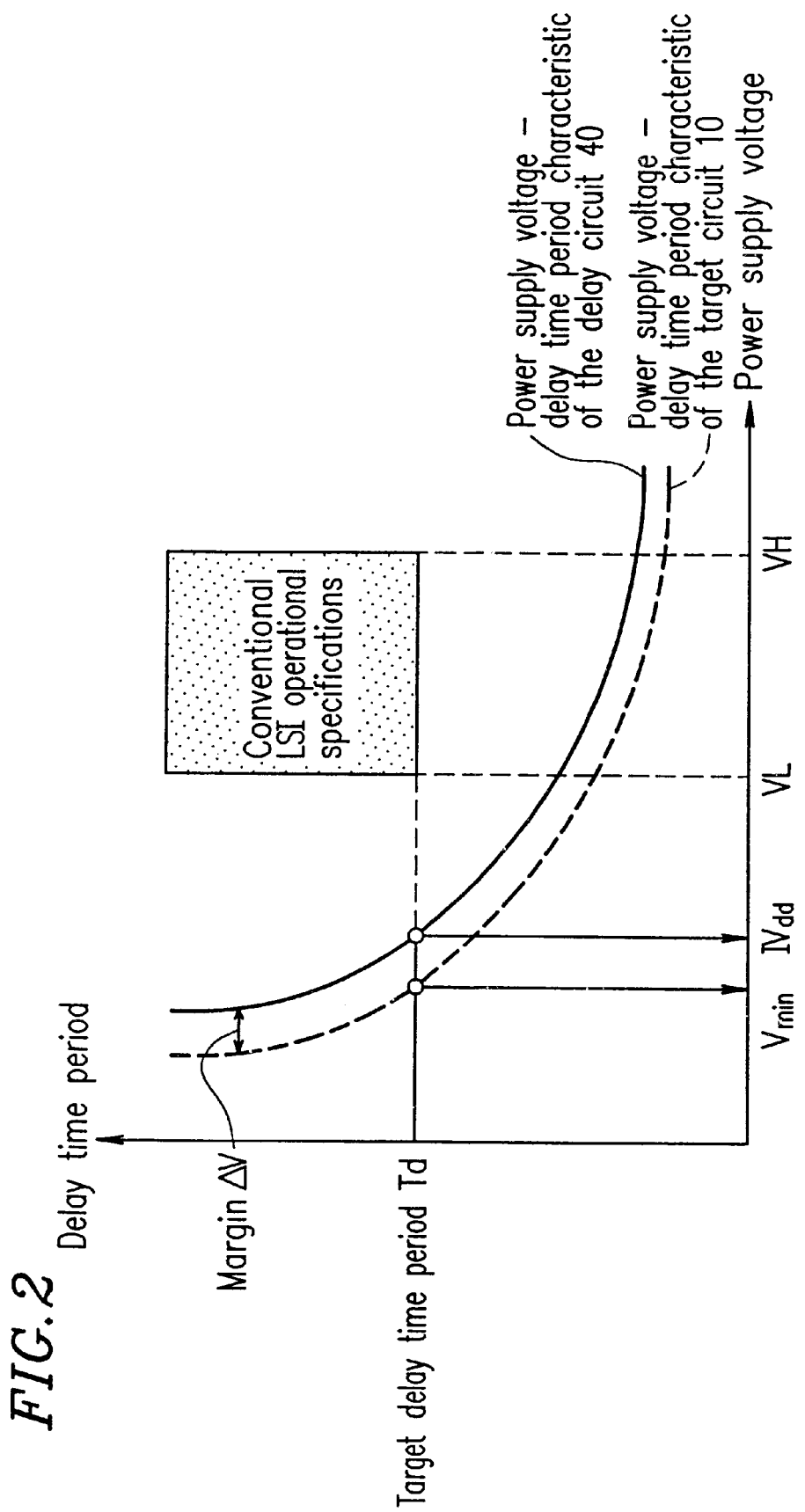
FIG. 2 is a view showing the relationship between the delay time period—power supply voltage characteristic of a target circuit 10 and the delay time period—power supply voltage characteristic of a delay circuit 40.

FIG. 2 shows the relationship between the delay time period—power supply voltage characteristic of the target circuit 10 and the delay time period—power supply voltage characteristic of the delay circuit 40. The target circuit 10 operates with the operating voltage $V_{OP}$ as the power supply voltage. The target circuit 10 operates with a shorter delay time period as the power supply voltage is higher, and operates with a longer delay time period as the power supply voltage is lower. The delay circuit 40 operates with the minimum voltage $IV_{dd}$ as the power supply voltage.

The delay time period—power supply voltage characteristic of the delay circuit 40 is adjusted in advance so as to adapt to the delay time period—power supply voltage characteristic of the target circuit 10 so as to maintain a margin $\Delta V$. As shown in FIG. 2, when the power supply voltage in the case where the target circuit 10 operates at a target device time period $T_d$ is $V_{min}$, the minimum voltage $IV_{dd}$ corresponding to the target delay time period $T_d$ is represented by $IV_{dd}=V_{min}+\Delta V$. Here, $\Delta V \geq 0$.

Such a margin $\Delta V$ is provided in order to absorb an influence of the voltage drop of the minimum voltage $IV_{dd}$ (or the operating voltage $V_{OP}$ supplied by the power supply circuit 50) and deviation in performance among different semiconductor chips. When $\Delta V=0$ (i.e., $IV_{dd}=V_{min}$), it is preferable to provide a circuit for adding the margin $\Delta V$ to the minimum voltage $IV_{dd}$ output from the minimum voltage detection circuit 30, between the minimum voltage detection circuit 30 and the target circuit 10.

The relationship between the delay time period—power supply voltage characteristic of the target circuit 10 and the delay time period—power supply voltage characteristic of the delay circuit 40 change so as to maintain the margin $\Delta V$ at a substantially constant value with respect to the process fluctuations and temperature fluctuations. The above-mentioned relationship is maintained in this manner since the target circuit 10 and the delay circuit 40 are integrated on the same LSI chip. Accordingly, it is possible to find the minimum voltage $IV_{dd}$ satisfying the processing capability of the target circuit 10 under any environment by monitoring the delay time period—power supply voltage characteristic of the delay circuit 40.

Figure 3:
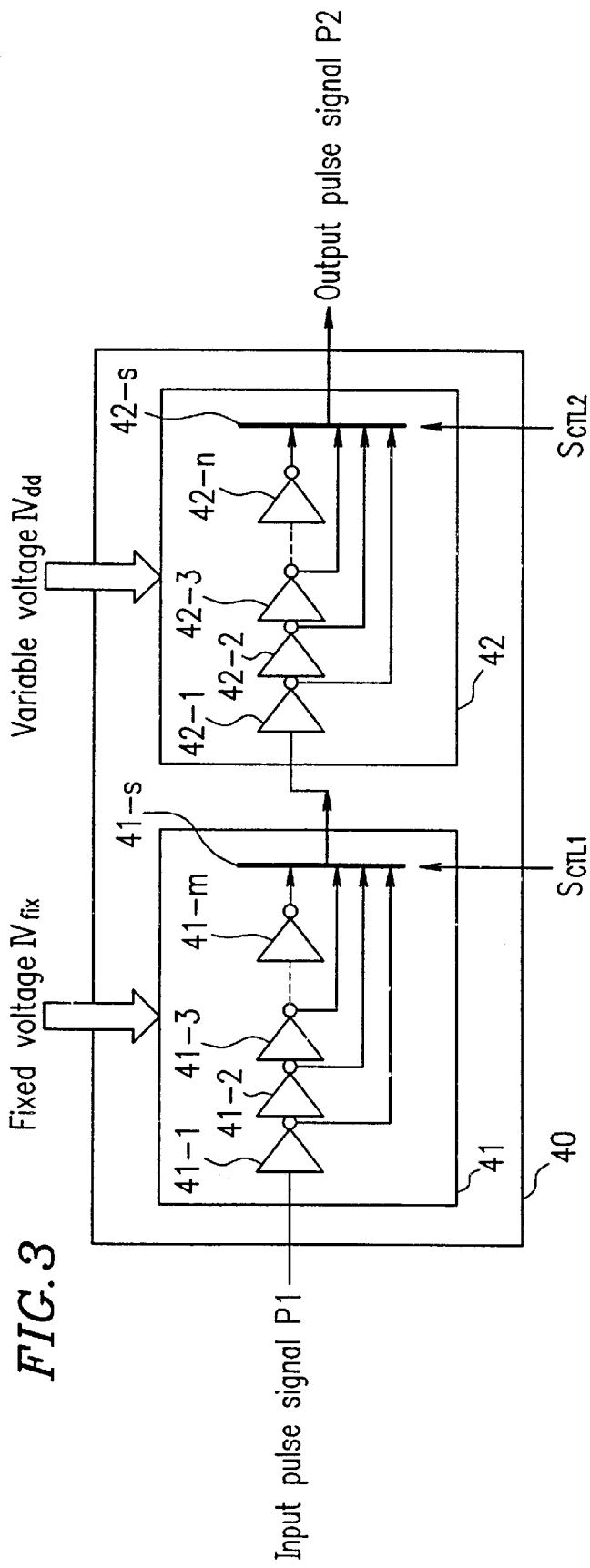
FIG. 3 is a view showing a structure of the delay circuit 40.

FIG. 3 shows a structure of the delay circuit 40. The delay circuit 40 includes a delay block 41 to which a fixed voltage $IV_{fix}$ is applied and a delay block 42 to which a variable voltage $IV_{dd}$ is applied. The input pulse signal P1 passes through the delay block 41 and the delay block 42, and then is output as the output pulse signal P2.

The delay block 41 includes m-number of delay units 41-1 through 41-m, and a selector 41-s. Herein, m is an arbitrary integer. Each of the delay units 41-1 through 41-m can be, for example, an inverter. The selector 41-s is used for adjusting a stage number N1 of the delay units, among the delay units 41-1 through 41-m, through which the input pulse signal P1 passes. The selector 41-s is controlled by a delay amount control signal $S_{CTL1}$. The delay amount control signal $S_{CTL1}$ is input to the delay circuit 40 through an external terminal 61 (see FIG. 1).

The delay block 42 includes n-number of delay units 42-1 through 42-n, and a selector 42-s. Herein, n is an arbitrary integer. Each of the delay units 42-1 through 42-n can be, for example, an inverter. The selector 42-s is used for adjusting a stage number N2 of the delay units, among the delay units 42-1 through 42-n, through which the input pulse signal P1 passes. The selector 42-s is controlled by a delay amount control signal $S_{CTL2}$. The delay amount control signal $S_{CTL2}$ is input to the delay circuit 40 through an external terminal 62 (see FIG. 1). Herein, the external terminals 61 and 62 can be a common external terminal.

In an alternative structure, the target circuit 10 generates the delay control signal $S_{CTL1}$ and/or the delay control signal $S_{CTL2}$ during the operation of the target circuit 10 and inputting the signals to the delay circuit 40, so that the stage number N1 of the delay units in the delay block 41 and/or the stage number N2 of the delay units in the delay block 42 are changed.

Figure 4:
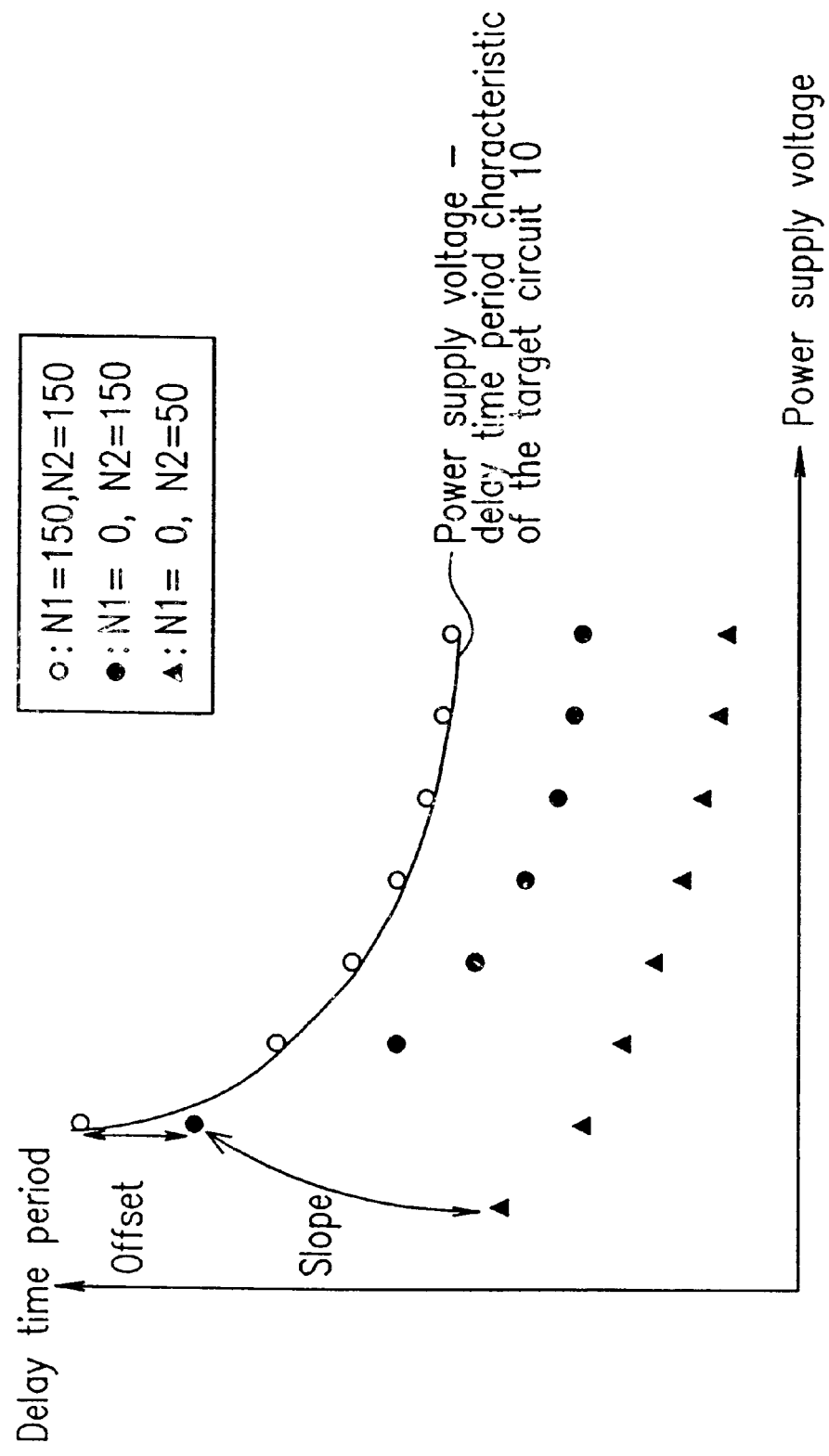
FIG. 4 is a view for explaining a method for adjusting the delay time period—power supply voltage characteristic of the delay circuit 40.

FIG. 4 is a view for explaining a method for adjusting the delay time period—power supply voltage characteristic of the delay circuit 40. In FIG. 4, the solid line represents the delay time period—power supply voltage characteristic of the target circuit 10. The delay time period—power supply voltage characteristic of the target circuit 10 is obtained by, for example, inputting a plurality of test vectors to the target circuit 10, the plurality of test vectors including a test vector corresponding to the maximum delay (critical path) of the target circuit 10, and then comparing the actual operation result of the target circuit 10 with a prescribed expected value for each of the plurality of test vectors.

The offset amount of the curve representing the delay time period—power supply voltage characteristic of the delay circuit 40 in a Y axis direction can be adjusted by adjusting the stage number N1 of the delay units in the delay block 41 through which the input pulse signal P1 passes in accordance with the delay control signal $S_{CTL1}$.

The slope of the curve representing the delay time period—power supply voltage characteristic of the delay circuit 40 can be adjusted by adjusting the stage number N2 of the delay units in the delay block 42 through which the input pulse signal P1 passes in accordance with the delay control signal $S_{CTL2}$.

For example, in FIG. 4, a plot of black triangles (▲) shows the delay time period—power supply voltage characteristic of the delay circuit 40 when N1=0 and N2=50. A plot of black circuits (●) shows the delay time period—power supply voltage characteristic of the delay circuit 40 when N1=0 and N2=150. A comparison between the plot of black triangles (▲) and the plot of black circles (●) shows that the plot of black circles (●) has a larger slope than the plot of black triangles (▲). A plot of white circles (○) shows the delay time period—power supply voltage characteristic of the target circuit 10 using when N1=150 and N2=150. A comparison between the plot of black circles (●) and the plot of the white circles (○) shows that the plot of the white crystals (○) has a larger offset amount than the plot of black circles (●).

It is possible to adapt the delay time period—power supply voltage characteristic of the delay circuit 40 to the delay time period—power supply voltage characteristic of the target circuit 10 with the margin ΔV by adjusting the offset amount and slope of the curve representing the delay time period—power supply voltage characteristic of the delay circuit 40 in advance in this manner. Alternatively, in some cases, the delay time period—power supply voltage characteristic of the delay circuit 40 can be adapted to the delay time period—power supply voltage characteristic of the target circuit 10 with the margin ΔV by adjusting the slope of the curve without adjusting the offset amount of the curve. In such cases, the delay block 41 can be omitted in the delay circuit 40 so that the input pulse signal P1 is input to the delay block 42 without passing through the delay block 41.

Figure 5:
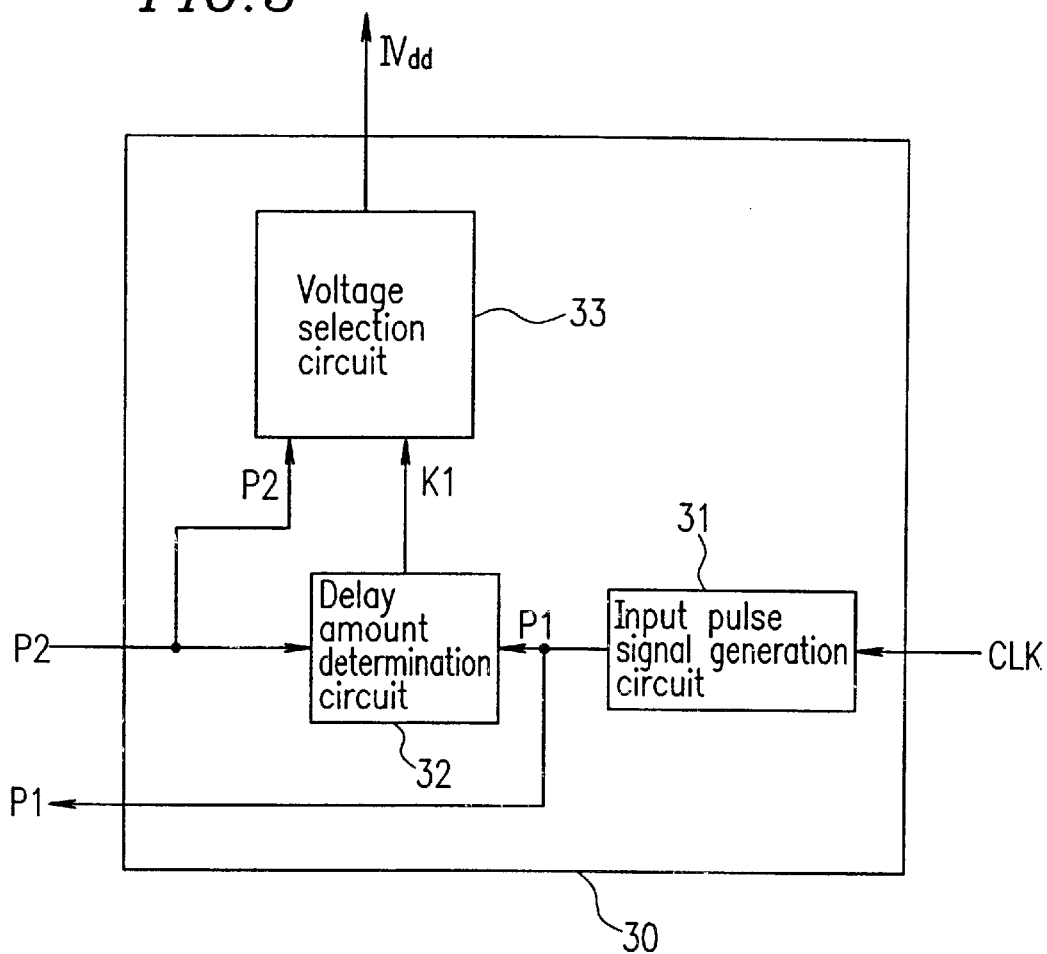
FIG. 5 is a view showing a structure of a minimum voltage detection circuit 30.

FIG. 5 shows a structure of the minimum voltage detection circuit 30. The minimum voltage detection circuit 30 includes an input pulse signal generation circuit 31, a delay amount determination circuit 32 and a voltage selection circuit 33.

The input pulse signal generation circuit 31 intermittently generates input pulse signals P1 based on the frequency of the clock CLK. Each input pulse signal P1 has a pulse width representing a target delay amount. The target delay amount is determined by the frequency of the clock CLK. The target delay amount is, for example, the length of one cycle of the clock CLK.

The delay amount determination circuit 32 determines whether or not the delay amount of the output pulse signal P2 with respect to the input pulse signal P1 is larger than the target delay amount, and outputs a determination signal K1 representing the determination result to the voltage selection circuit 33. In the case where the delay amount of the output pulse signal P2 with respect to the input pulse signal P1 is larger than the target delay amount, the determination signal K1 is at a high level. Otherwise, the determination signal K1 is at a low level. Accordingly, the determination signal K1 can be represented by 1 bit.

The voltage selection circuit 33 selects one of a plurality of different voltages prepared in advance, in accordance with the determination signal K1, and outputs the selected voltage as the minimum voltage $IV_{dd}$. The determination signal K1 is used for instructing whether one of higher voltages or one of lower voltages should be output among the plurality of voltages. Specifically, when the determination signal K1 is high, that means one of higher voltages among the plurality of voltages should be output; and when the determination signal K1 is low, that means one of lower voltages among the plurality of voltages should be output. The output pulse signal P2 is used for controlling the timing at which the minimum voltage $IV_{dd}$ is update.

Figure 6:
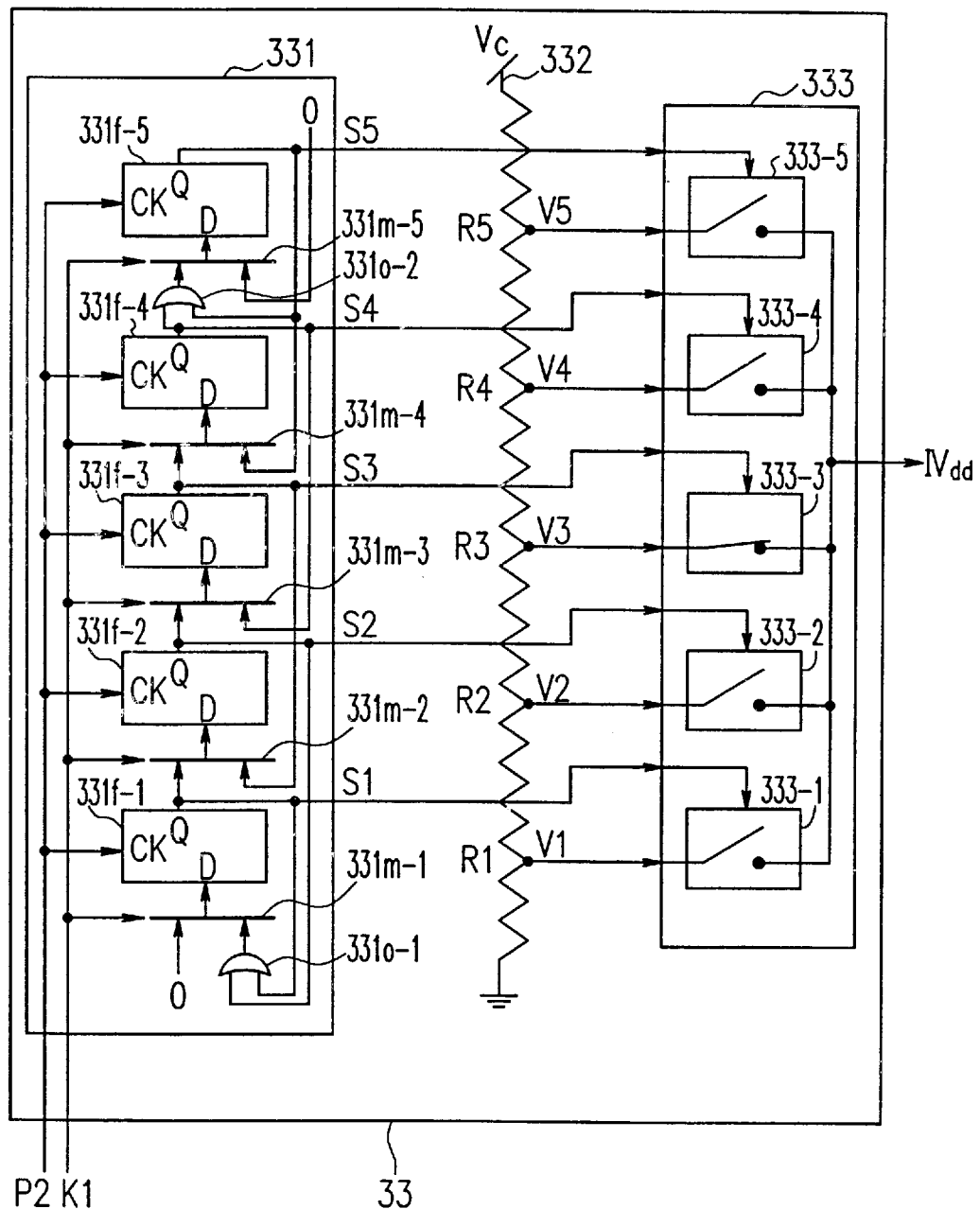
FIG. 6 is a view showing a structure of a voltage selection circuit 33.

FIG. 6 shows a structure of the voltage selection circuit 33. The voltage selection circuit 33 includes a bidirectional shift control circuit 331, a register 332 and a switch circuit 333.

The bidirectional shift control circuit 331 includes D flip-flops 331f-1 through 331f-5, 2-input, 1-output multiplexers 331m-1 through 331m-5, and Or circuits 331o-1 and 331o-2.

To each of the D flip-flops 331f-1 through 331f-5, a previous-stage D flip-flop or a subsequent-stage D flip-flop is input in synchronization with the rising edge of the output pulse signal P2. One of the D flip-flops 331f-1 through 331f-5 retains data having the value of "1", and the remaining D flip-flops retain data having the value of "0".

The multiplexers 331m-1 through 331m-5 each select data to be stored in the D flip-flop corresponding thereto in accordance with the level of the determination signal K1.

The OR circuit 331o-1 is provided for preventing deletion of data having the value of "1" where the data having the value of "1" is stored in the D flip-flop 331f-1 and the determination signal K1 is at a low level.

Similarly, the OR circuit 331o-2 is provided for preventing deletion of data having the value of "1" where the data having the value of "1" is stored in the D flip-flop 331f-5 and the determination signal K1 is at a high level.

The OR circuits 331o-1 and 331o-2 further have a function of preventing malfunction of the power management circuit 20 in a transition state when the power is turned on.

The bidirectional shift control circuit 331 having the above-described structure functions so as to make one of control signals S1 through S5 high in accordance with the determination signal K1 and maintain the remaining control signals low. For example, the state of the bidirectional shift control circuit 331 when the control signal S5 is high and the control signal S1 through S4 are low is referred to as state 1. State 1 can be represented as follows.

State 1: (S1, S2, S3, S4, S5)=(0, 0, 0, 0, 1)

In state 1, when the determination signal K1 at a low level is input to the bidirectional shift control circuit 331, state 1 changes to state 2.

State 2: (S1, S2, S3, S4, S5)=(0, 0, 0, 1, 0)

In state 2, when the determination signal K1 at a low level is input to the bidirectional shift control circuit 331, state 2 changes to state 3.

State 3: (S1, S2, S3, S4, S5)=(0, 0, 1, 0, 0)

In state 3, when the determination signal K1 at a high level is input to the bidirectional shift control circuit 331, state 3 changes to state 4.

State 4: (S1, S2, S3, S4, S5)=(0, 0, 0, 1, 0)

In this manner, the control signal at a high level is shifted one by one among the control signals S1 through S5. The level of the determination signal K1 indicates the direction of the shift. The timing at which the state of the bidirectional shift control circuit 331 changes is in synchronization with the rising edge of the output pulse signal P2.

Thus, the bidirectional shift control circuit 331 operates only in response to the determination signal K1 and the output pulse signal P2. Accordingly, it is very easy to control the bidirectional shift control circuit 331.

One end of the resistor 332 is connected to the power supply voltage $V_c$, and the other end of the resistor 332 is connected to the ground voltage. The voltages at points R1 through R5 of the resistor 332 are respectively supplied to the switch circuit 333 as voltages V1 through V5 in accordance with a resistance division method. Herein, V1<V2<V3<V4<V5.

The switch circuit 333 includes a plurality of switch elements 333-1 through 333-5. One end of each of the switch elements 333-1 through 333-5 is connected to a voltage corresponding thereto. The control signals S1 through S5 are respectively used for turning on or off the switch elements 333-1 through 333-5. Only the switch elements corresponding to the control signals at a high level are turned on, and the voltages corresponding to such switch elements are selectively output.

The voltage selection circuit 33 preferably has a function of restricting the range of the voltage $IV_{dd}$ output from the voltage selection circuit 33 to a prescribed range, since the target circuit 10 does not operate in a low voltage range according to the specifications of the target circuit 10. The range of the voltage $IV_{dd}$ is restricted by, for example, restricting the stage number of the D flip-flops and selectors included in the bidirectional shift control circuit 331.

Figure 7:
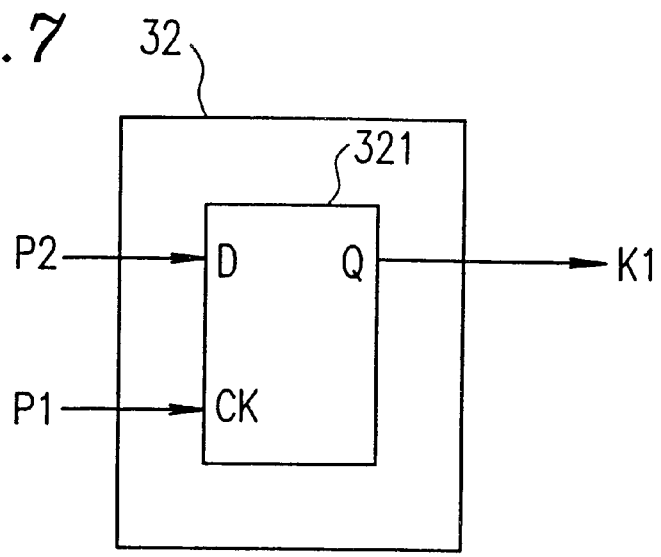
FIG. 7 is a view showing a structure of a delay amount determination circuit 32.

FIG. 7 shows a structure of the delay amount determination circuit 32. The delay amount determination circuit 32 includes a D flip-flop 321. The D flip-flop 321 has a data input terminal D, a clock input terminal CK and an output terminal Q. The output pulse signal P2 is input to the data input terminal D. The input pulse signal P1 is input to the clock input terminal CK. The determination signal K1 is output from the output terminal Q.

The phase relationship between the input pulse signal P1 and the output pulse signal P2 is different among two cases. In one case, the output pulse signal P2 is at a low level at the rising end of the input pulse signal P1. In the other case, the output pulse signal P2 is at a high level at the rising end of the input pulse signal P1.

Figure 8A:
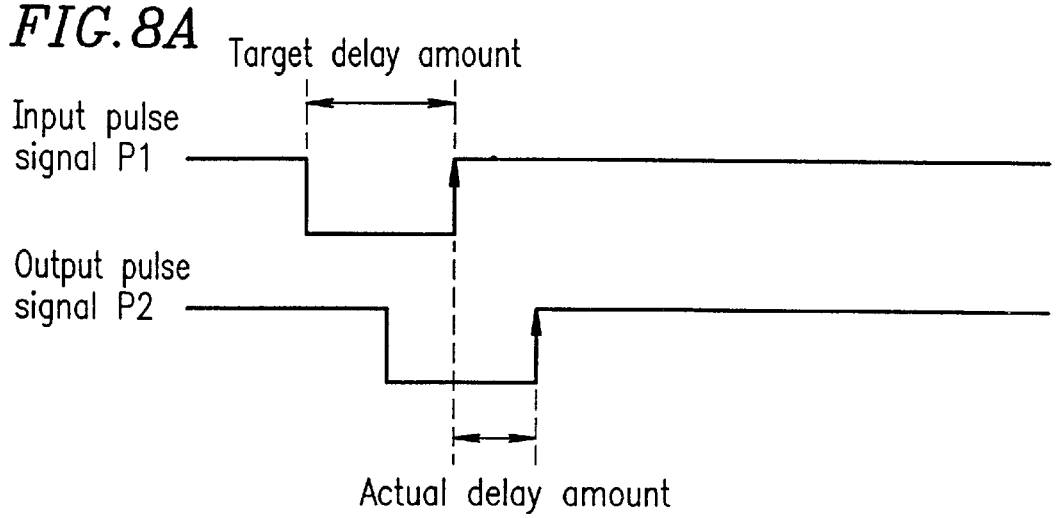
FIGS. 8A through 8C are views showing the phase relationship between an input pulse signal P1 and an output pulse signal P2.

FIG. 8A shows the case where the output pulse signal P2 is at a low level at the rising end of the input pulse signal P1. This case corresponds to the case where the delay amount of the output pulse signal P2 with respect to the input pulse signal P1 (actual delay amount) is smaller than the target delay amount, since the pulse width of the input pulse signal P1 corresponds to the target delay amount.

In the case shown in FIG. 8A, the delay amount determination circuit 32 outputs a low-level determination signal K1 since the D flip-flop 321 in the delay amount determination circuit 32 takes in the level of the output pulse signal P2 (low level) as data at the rising edge of the input pulse signal P1. As described above, the voltage selection circuit 33 controls the minimum voltage $IV_{dd}$ to be lower than before (the receipt of the low-level determination signal K1) in response to the low-level determination signal K1. As a result, the delay amount of the output pulse signal P2 with respect to the input pulse signal P1 is increased. Thus, the delay amount of the output pulse signal P2 with respect to the input pulse signal P1 is feedback-controlled so as to be closer to the target delay amount.

Figure 8B:
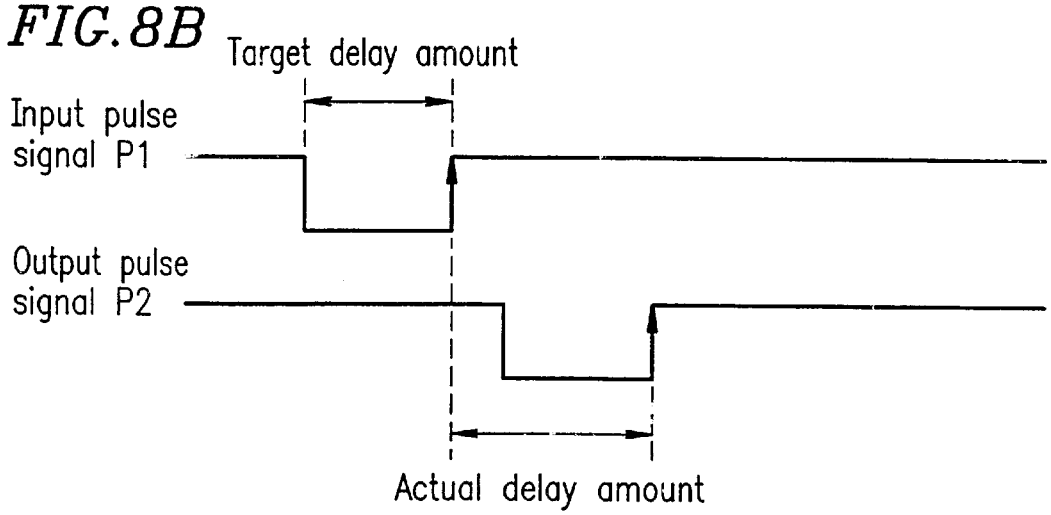

FIG. 8B shows the case where the output pulse signal P2 is at a high level at the rising end of the input pulse signal P1. This case corresponds to the case where the delay amount of the output pulse signal P2 with respect to the input pulse signal P1 (actual delay amount) is larger than the target delay amount, since the pulse width of the input pulse signal P1 corresponds to the target delay amount.

In the case shown in FIG. 8B, the delay amount determination circuit 32 outputs a high-level determination signal K1 since the D flip-flop 321 in the delay amount determination circuit 32 takes in the level of the output pulse signal P2 (high level) as data at the rising edge of the input pulse signal P1. As described above, the voltage selection circuit 33 controls the minimum voltage $IV_{dd}$ to be higher than before (the receipt of the high-level determination signal K1) in response to the high-level determination signal K1. As a result, the delay amount of the output pulse signal P2 with respect to the input pulse signal P1 is reduced. Thus, the delay amount of the output pulse signal P2 with respect to the input pulse signal P1 is feedback-controlled so as to be closer to the target delay amount.

Figure 8C:
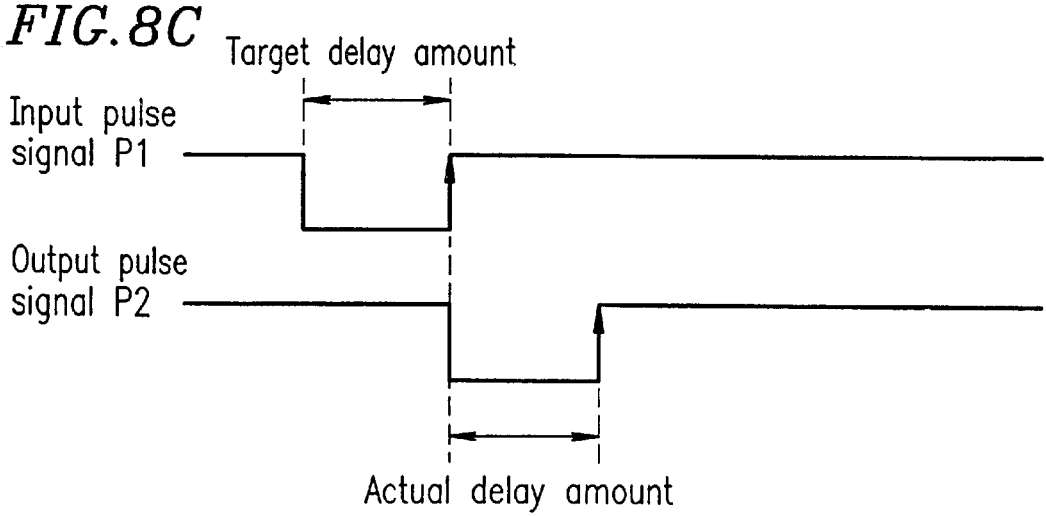

FIG. 8C shows a state in which the phase relationship between the input pulse signal P1 and the output pulse signal P2 is locked by the above-described feedback control. Thus, the voltage selection circuit 33 feedback-controls the minimum voltage $IV_{dd}$ so that the rising edge of the input pulse signal P1 matches the falling edge of the output pulse signal P2.

It should be noted that in such a locked state, the minimum voltage $IV_{dd}$ alternates between two voltages. The reason for this is that even in the locked state, the determination signal K1 can be at only either a high level or a low level. An improvement for maintaining the level of the minimum voltage $IV_{dd}$ in the locked state will be described later.

FIG. 9 shows a change in the minimum voltage $IV_{dd}$ from the transition state to the locked state. In this example, the minimum voltage $IV_{dd}$ is initialized to the highest voltage V5 which can be output from the voltage selection circuit 33. The minimum voltage $IV_{dd}$ is preferably initialized to the highest voltage which can be output from the voltage selection circuit 33 in order to prevent malfunction from occurring due to deterioration of the processing capability of the target circuit 10.

As shown in FIG. 9, the minimum voltage $IV_{dd}$ alternates between two voltages (e.g., voltages V2 and V1) in the locked state. In the case where the difference between the two voltages is sufficiently small, the alternation of the minimum voltage $IV_{dd}$ in the locked state causes substantially no problem in operating the target circuit 10.

Figure 10A:
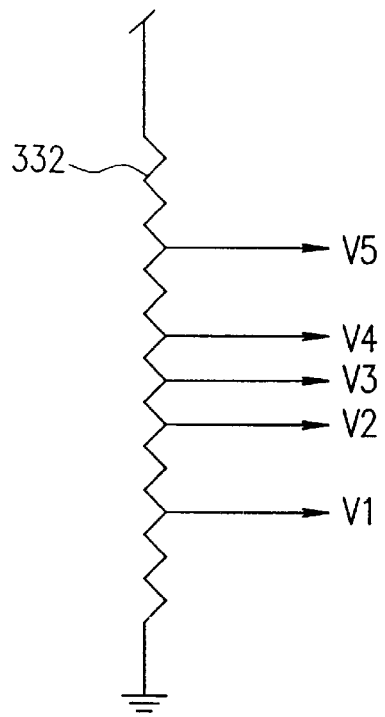
FIGS. 10A through 10C are views showing a method for dividing a resistor 332.
Figure 10B:
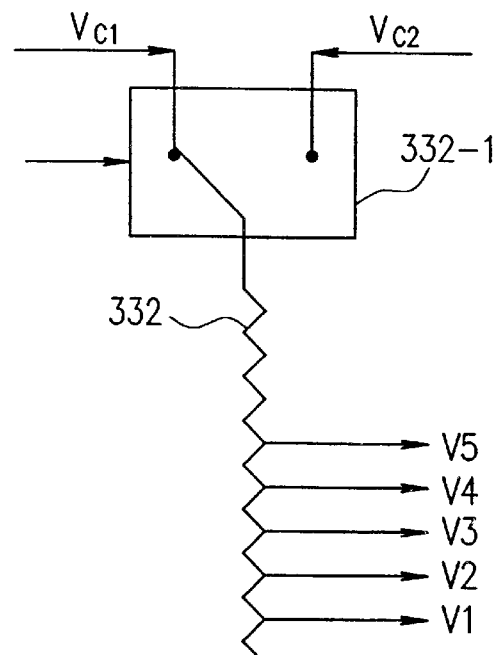

In the case where a voltage to which the minimum voltage $IV_{dd}$ is converged in the locked state is known in advance, the alternation of the minimum voltage $IV_{dd}$ can be suppressed by dividing the resistor 332 in, for example, particular manner shown in FIGS. 10A and 10B.

FIG. 10A shows an example in which the voltages V2 through V4 are concentrated in the vicinity of a voltage to which the voltages are finally converged in the locked state. Thus, the alternation of the minimum voltage $IV_{dd}$ can be suppressed without increasing the size of the hardware.

FIG. 10B shows an example in which the resistor 332 is divided at a shorter interval and a switch 332-1 is provided between power supply voltages $V_{o1}/V_{o2}$ and one end of the resistor 332, so that the power supply voltages applied to the one end of the resistor 332 are switchable. Thus, the alternation of the minimum voltage $IV_{dd}$ can be suppressed in accordance with the type of the target circuit 10.

The alternation of the minimum voltage $IV_{dd}$ can also be removed by passage through a low-pass filter.

In the first example above, the input pulse signals P1 are intermittently generated by the input pulse signal generation circuit 31. The input pulse signal P1 is intermittently generated for the following reasons (1) through (3).

(1) In order to suppress wasteful power consumption.

(2) In the above description, the voltage selection circuit 33 updates the minimum voltage $IV_{dd}$ in synchronization with the rising edge of the output pulse signal P2. Accordingly, it is required to sufficiently stabilize the power supply voltage (equal to the minimum voltage $IV_{dd}$) of the delay circuit 40 by the next input of the input pulse signal P1 to the delay circuit 40.

(3) In order to avoid an inappropriate locked state. When input pulse signals P1 are continuously generated, the minimum voltage $IV_{dd}$ may be undesirably feedback-controlled so that the rising edge of the input pulse signal P1 matches the falling edge of the output pulse signal P2 which does not correspond to the above-mentioned input pulse signal P1.

Figure 11A:
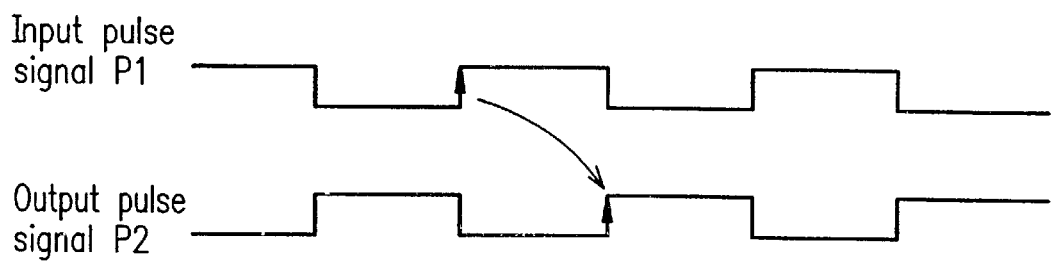
FIG. 11A is a view showing the correspondence between a rising edge of the input pulse signal P1 and a rising edge of the output pulse signal P2 in an appropriate locked state.
Figure 11B:
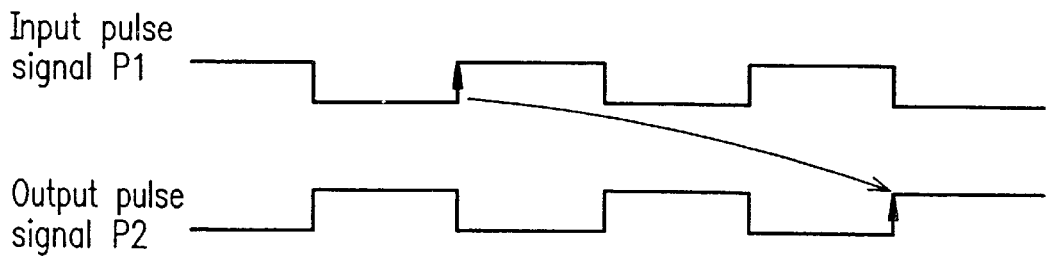
FIG. 11B is a view showing the correspondence between a rising edge of the input pulse signal P1 and a rising edge of the output pulse signal P2 in an inappropriate locked state.

FIG. 11A shows the correspondence between the rising edge of the input pulse signal P1 and the rising edge of the output pulse signal P2 in an appropriate locked state. FIG. 11B shows the correspondence between the rising edge of the input pulse signal P1 and the rising edge of the output pulse signal P2 in an inappropriate locked state.

Hereinafter, the power consumed by the minimum voltage detection circuit 30 and the delay circuit 40 will be considered.

The power consumed by the minimum voltage detection circuit 30 and the delay circuit 40 is mainly consumed by intermittent operation of the delay circuit 40 and operation of the resistor 332. The bidirectional shift control circuit 321 has an advantage of consuming substantially no power. The reason for this is that in the bidirectional shift control circuit 321, only two pieces of data among the data retained in all the D flip-flops change simultaneously.

In order to reduce the power consumed by the minimum voltage detection circuit 30 and the delay circuit 40, the following methods are effective.

Figure 10C:
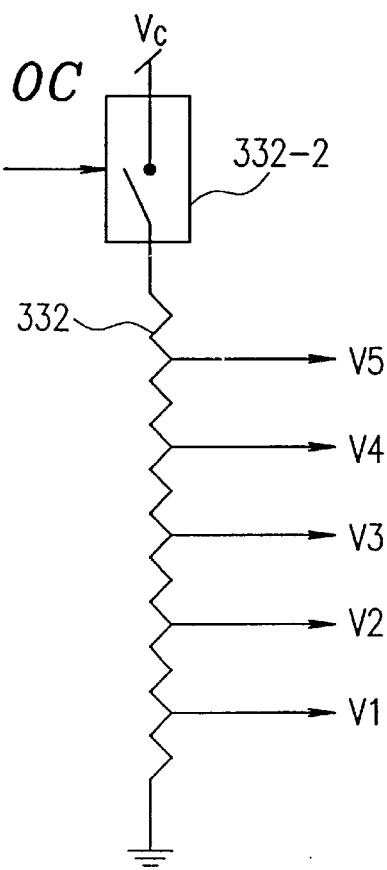

Generally, a mode referred to as sleep mode is often prepared in an LSI for use in a portable apparatus. In the case where such an LSI is the target circuit 10, it is preferable to, as shown in FIG. 10C, provide a switch 332-2 between one end of the resistor 332 and the power supply voltage $V_c$, so that the switch 332-2 is turned off during the sleep mode to block the current flowing through the resistor 332. It can also be structured that the pulse input signal P1 is not generated during the sleep mode.

The minimum voltage detection circuit 30, once put into the locked state, merely follows the temperature change of the delay circuit 40. Accordingly, it is preferable to generate the input pulse signals P1 at a relatively short interval at the transition response to guide the minimum voltage detection circuit 30 to the locked state, and to generate the input pulse signals P1 at a longer interval after the minimum voltage detection circuit 30 is put into the locked state. Thus, the power consumption in the locked state can be reduced.

Figure 12A:
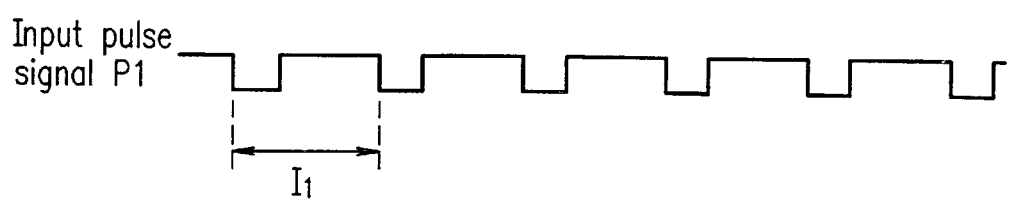
FIG. 12A is a view showing an example of generation interval $I_1$ of the input pulse signals P1 at transition response.
Figure 12B:
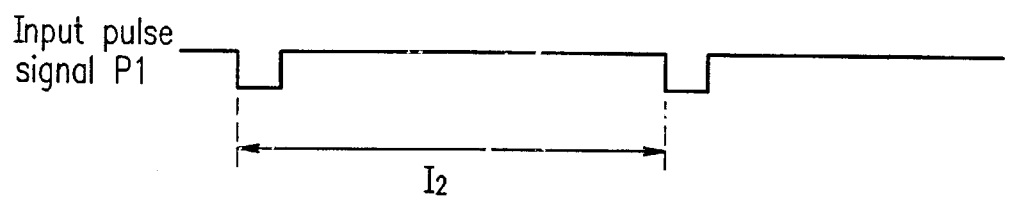
FIG. 12B is a view showing an example of generation interval $I_2$ of the input pulse signals P1 in the locked state.

FIG. 12A shows an example of a generation interval $I_1$ of the input pulse signals P1 at the transition response. FIG. 12B shows an example of a generation interval $I_2$ of the input pulse signals P1 in the locked state.

The generation intervals of the input pulse signals P1 can be switched in association with a reset period of the LSI by the system. The reason for this is that it is preferable to generate the input pulse signals P1 at a relatively short interval at the time of resetting to quickly put the minimum voltage detection circuit 30 into a stable state and to generate the input pulse signals P1 during the operation of the LSI after resetting. Thus, the power consumption during the operation of the LSI after resetting can be reduced.

In the case where an output impedance from the resistor 332 is high, the minimum voltage $IV_{dd}$ can be supplied to the delay circuit 40 through a buffer. Thus, the power consumed by the resistor 332 can be reduced. The reason for this is that insertion of such a buffer can raise the resistance and thus reduce the current flowing through the resistor 332 in a steady state.

Hereinafter, a voltage selection circuit 33a for maintaining the level of the minimum voltage $IV_{dd}$ in the locked state will be described.

Figure 13:
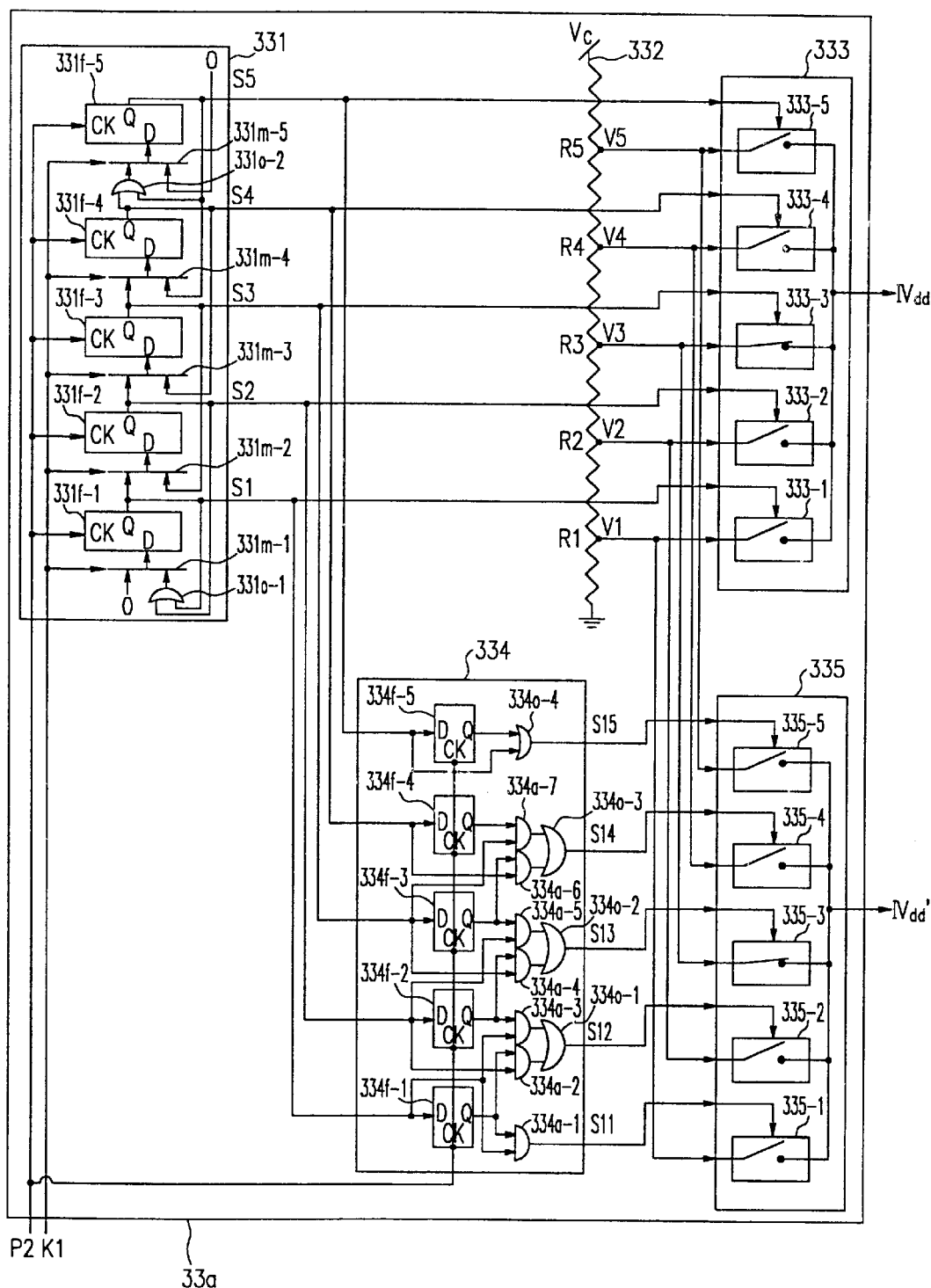

FIG. 13 shows a structure of an improved voltage selection circuit 33a. The voltage selection circuit 33a includes a state retaining circuit 334 and a switch circuit 335 in addition to the structure of the voltage selection circuit 33 shown in FIG. 6.

The state retaining circuit 334 includes D flip-flop 334f-1 through 334f-5, AND circuits 334a-1 through 334a-7, and OR circuits 334o-1 through 334o-4.

To the D flip-flops 334f-1 through 334f-5, data from the D flip-flops 334f-1 through 331f-5 are respectively input in synchronization with the rising edge of the output signal pulse P2. Accordingly, the state retaining circuit 334 retains the state of the bidirectional shift control circuit 331 which is immediately prior to the present state. Hereinafter, the state of the bidirectional shift control circuit 331 which is immediately prior to the present state will be referred to as a "previous state" and the present state of the bidirectional shift control circuit 331 will be referred to as a "present state".

The state retaining circuit 334 outputs the control signals S11 through S15 based on the control signals S1 through S5. The control signals S11 through S15 become high when the following conditions are fulfilled and otherwise are low.

S11: S1 in the previous state is high, and S1 in the present state is high.

S12: (S2 in the previous state is high, and S1 in the present state is high) or (S1 in the previous state is high, and S2 in the present state is high).

S13: (S3 in the previous state is high, and S2 in the present state is high) or (S2 in the previous state is high, and S3 in the present state is high).

S14: (S4 in the previous state is high, and S3 in the present state is high) or (S3 in the previous state is high, and S4 in the present state is high).

S15: S5 in the previous state is high, and S5 in the present state is high.

One of the control signals S1 through S5 becomes high, and the position of the control signal which is high both in the previous state and the present state is shifted by one. Therefore, according to the above-described logic of the control signals S11 through S15, the control signal among the control signals S11 through S15 which becomes high is a control signal which corresponds to the higher voltage among the voltage of one of the control signals S1 through S5 which was high in the previous state and the voltage of one of the control signals S1 through S5 which is high in the present state.

The switch circuit 335 includes a plurality of switch elements 335-1 through 335-5. To one of each of the switch elements 335-1 through 335-5, a corresponding voltage is supplied. The control signals S11 through S15 are respectively used for controlling whether the switch elements 335-1 through 335-5 are on or off. Only the switch elements corresponding to the control signal at a high level are turned on, and the voltages corresponding to such switch elements are selectively output.

In this manner, the voltage $IV_{dd}'$ is output from the switch circuit 335. The voltage $IV_{dd}'$ is supplied to the power supply circuit 50. The voltage $IV_{dd}$ output from the switch circuit 333 is supplied to the delay circuit 40.

Figure 14:
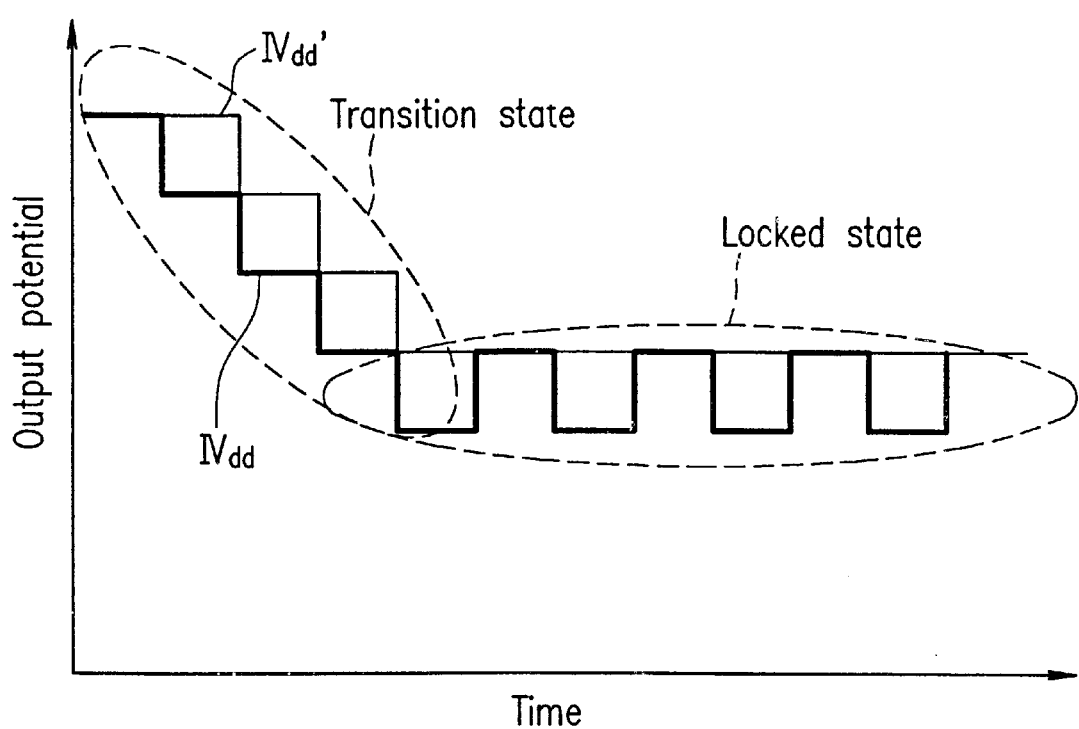
FIG. 14 is a view showing a change of the improved voltage selection circuit 33a from a transition state to a locked state.

FIG. 14 shows a change of the voltage output from the improved voltage selection circuit 33a from the transition state to the locked state. In FIG. 14, the thin line represents the change of the voltage $IV_{dd}'$ supplied from the voltage selection circuit 33a to the power supply circuit 50, and the thick line represents the change of the voltage $IV_{dd}$ supplied from the voltage selection circuit 33a to the delay circuit 40. As shown in FIG. 14, the voltage $IV_{dd}'$ is maintained at a given level in the locked state.

Figure 15A:
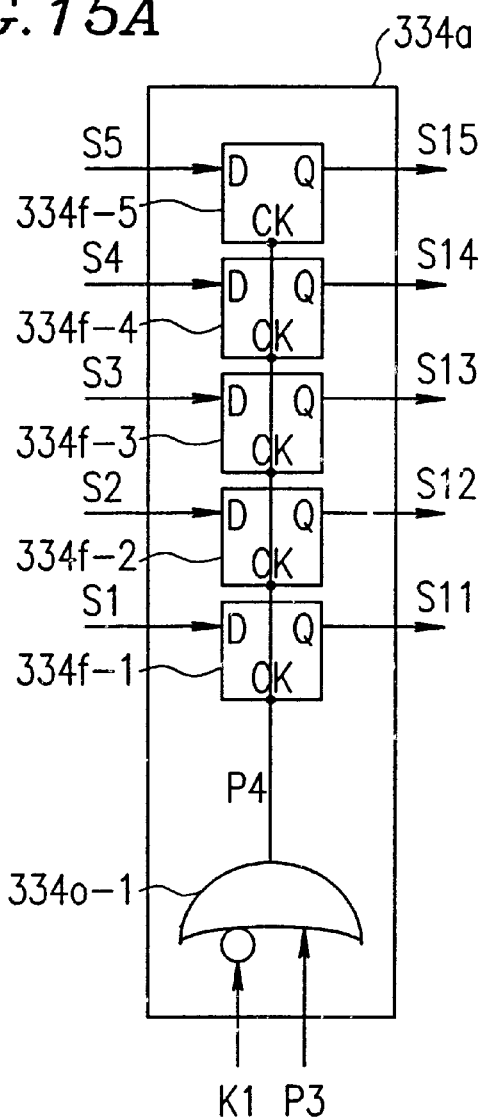

FIG. 15A shows a structure of an improved state retaining circuit 334a. The state retaining circuit 334a has a simpler structure than that of the state retaining circuit 334 shown in FIG. 14. The state retaining circuit 334 can be replaced with the state retaining circuit 334a.

The state retaining circuit 334a includes D flip-flops 334f-1 through 334f-5 and an OR circuit 334o-1.

To the D flip-flops 334f-1 through 334f-5, data are respectively input from the D flip-flops 334f-1 through 334f-5 in synchronization with the rising edge of a pulse signal P4.

Figure 15B:
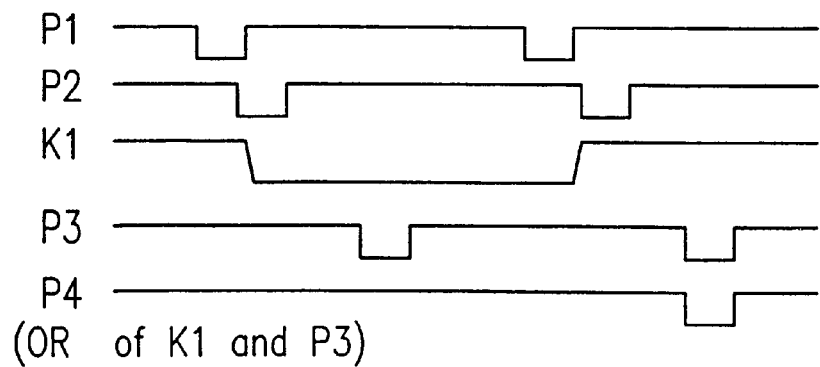
FIG. 15B is a view showing waveforms of pulse signals P3 and P4.

The pulse signal P4 is obtained by performing a logical operation OR with respect to the denial of the determination signal K1 and a pulse signal P3 (see FIG. 15B). In other words, the pulse signal P4 is output in accordance with the pulse signal P3 only during a period in which the determination signal K1 is at a high level. The period in which the determination signal K1 is at a high level corresponds to a period in which the voltage $IV_{dd}$ is raised.

As shown in FIG. 15B, the pulse signal P3 has a different phase from that of the input pulse signal P1. The pulse signal P3 can be generated by the input pulse signal generation circuit 31.

In this manner, the data stored in the D flip-flops 334f-1 through 334f-5 is updated when the voltage $IV_{dd}$ output from the switch circuit 335 is raised.

Accordingly, when the voltage $IV_{dd}$ output from the switch circuit 33 is raised, the voltage $IV_{dd}'$ output from the switch circuit 335 is updated to have the value of the voltage $IV_{dd}$. The voltage $IV_{dd}'$ is not updated otherwise. An initial value of the voltage $IV_{dd}'$ is equal to the initial value of the voltage $IV_{dd}$.

Figure 16:
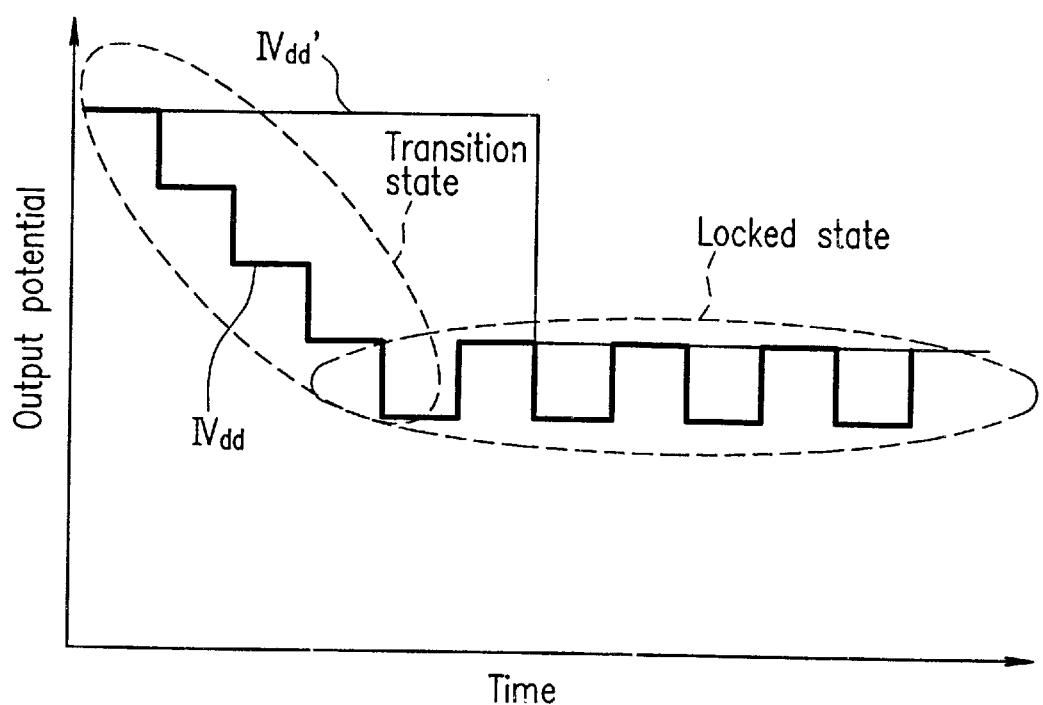
FIG. 16 is a view showing a change of a voltage output from the improved voltage selection circuit 33a from a transition state to a locked state.

FIG. 16 shows a change of the voltage output from the voltage selection circuit 33a including the improved state retaining circuit 334a from the transition state to the locked state. In FIG. 16, the thin line represents the change of the voltage $IV_{dd}'$ supplied from the voltage selection circuit 33a to the power supply circuit 50, and the thick line represents the change of the voltage $IV_{dd}$ supplied from the voltage selection circuit 33a to the delay circuit 40. As shown in FIG. 16, the voltage $IV_{dd}'$ is maintained at a given level in the locked state.

Figure 17:
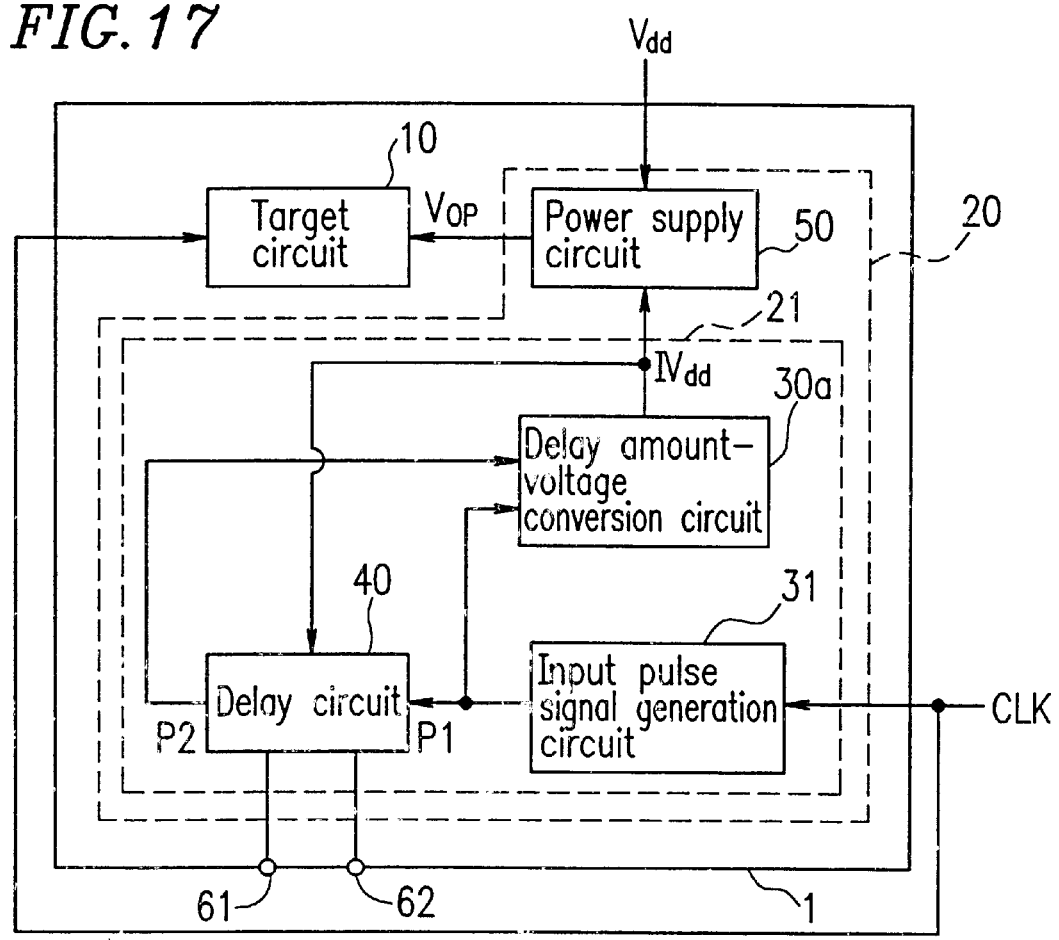
FIG. 17 is a view showing a structure of the system 1 in the first example according to the present invention.

FIG. 17 shows the structure of the system 1 in the first example according to the present invention in a different representation from FIG. 1. In FIG. 17, identical elements as those of the system 1 shown in FIG. 1 bear identical reference numerals.

The function of the minimum voltage detection circuit 30 in FIG. 1 is divided into the input pulse signal generation circuit 31 and a delay amount-voltage conversion circuit 30a in FIG. 17.

The input pulse signal generation circuit 31 intermittently generates input pulse signals P1 in accordance with the frequency of the clock CLK. Each input pulse signal P1 has a pulse width representing a target delay amount. The input pulse signal P1 is supplied to the delay circuit 40 and the delay amount-conversion circuit 30a.

To the delay amount-conversion circuit 30a, the input pulse signal P1 and the output pulse signal P2 output from the delay circuit 40 are input. The delay amount-conversion circuit 30a outputs the voltage $IV_{dd}$ in accordance with the delay amount of the output pulse signal P2 with respect to the input pulse signal P1.

Figure 18:
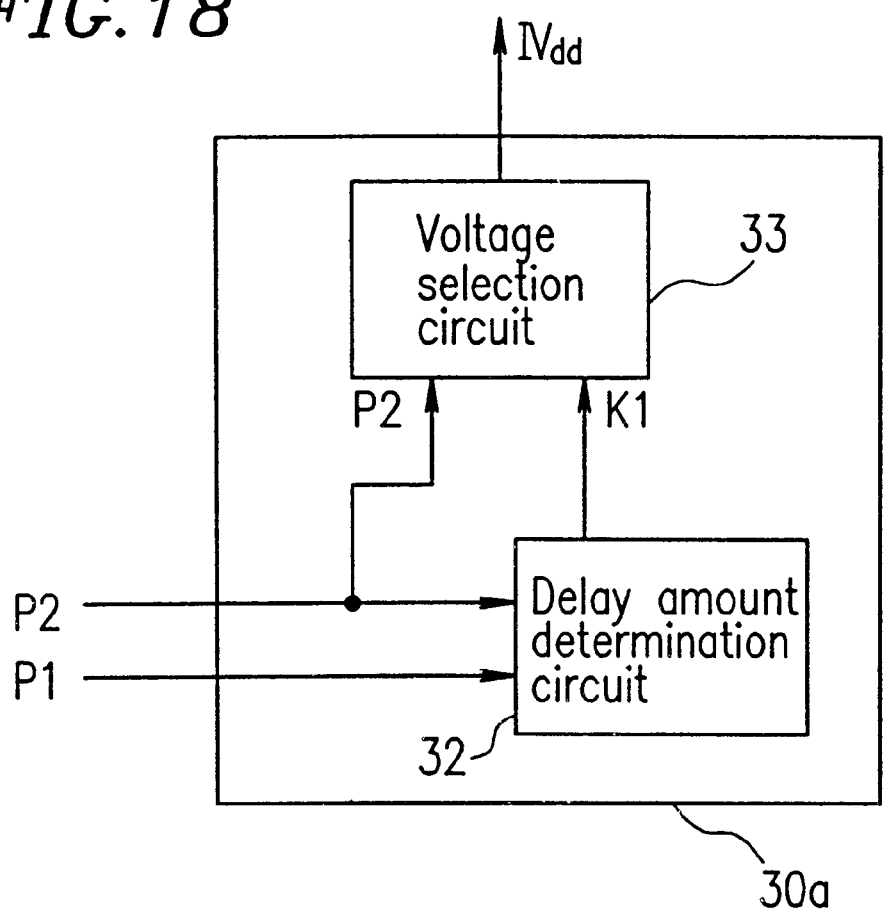

FIG. 18 shows a structure of the delay amount-voltage conversion circuit 30a. The delay amount-voltage conversion circuit 30a includes the delay amount determination circuit 32 and the voltage selection circuit 33. The functions and operations of the delay amount determination circuit 32 and the voltage selection circuit 33 are identical with those illustrated in FIG. 5, and thus the descriptions thereof are omitted here.

Those skilled in the art would appreciate that the system 1 shown in FIG. 1 and the system 1 shown in FIG. 17 realize identical functions and operations. the input pulse signal generation circuit 31, the delay circuit 40 and the delay amount-voltage conversion circuit 31a is to receive the clock CLK as an input and provide the voltage $IV_{dd}$ in accordance with the frequency of the clock CLK as an output. In other words, a frequency-voltage conversion circuit 21 indicated with dashed line in FIG. 17 converts the frequency (input) of the clock CLK into the voltage $IV_{dd}$ (output) in accordance with a prescribed input and output characteristic. Herein, the voltage $IV_{dd}$ is obtained by adding a margin $\Delta V$ to the minimum voltage $V_{min}$ required for the target circuit 10 to operate. The minimum voltage $V_{min}$ is determined in accordance with the frequency of the clock CLK. Herein, $\Delta V \geq 0$.

When $\Delta V=0$ (i.e., $IV_{dd}=V_{min}$), it is preferable to provide, between the frequency-voltage conversion circuit 21 and the target circuit 10, a circuit for adding the margin $\Delta V$ to the voltage $IV_{dd}$ output from the frequency-voltage conversion circuit 21.

In the first example, adjustment of the slope of the delay time period-power supply voltage characteristic of the delay circuit 40 using the delay control signal $S_{CTL2}$ means adjustment of the slope of the input and output characteristic of the frequency-voltage conversion circuit 21. The reason for this is that power supply voltage of the delay circuit 40 is equal to the voltage $IV_{dd}$, and the delay time period by the delay circuit 40 and the frequency of the clock CLK are reciprocal to each other. In a similar sense, adjustment of the offset amount of the delay time period-power supply voltage characteristic of the delay circuit 40 using the delay control signal $S_{CTL1}$ means adjustment of the offset amount of the input and output characteristic of the frequency-voltage conversion circuit 21. Thus, the frequency-voltage conversion circuit 21 provides one embodiment of the frequency-voltage conversion circuit which is structured to make the slope and offset amount of the input and output characteristic thereof adjustable.

The adjustment of the slope and offset amount of the delay time period-power supply voltage characteristic of the delay circuit 40 is achieved by adjusting the delay state number N1 of the delay block 41 and the delay stage number N2 of the delay block 42 which are included in the delay circuit 40. Regarding the structures of the delay blocks 41 and 42, refer to FIG. 3.

The slope of the delay time period-power supply voltage characteristic of the delay circuit 40 is adjusted by, for example, determining the delay stage number N2 of the delay block 42 in accordance with expression (1).

$$N2 = n \cdot (K_T / K_{INIT}) \quad (1)$$

Herein, $K_{INIT}$ represents the slope of the delay time period-power supply voltage characteristic of the delay circuit 40 in the case where the pulse width of the input pulse signal P1 is equal to one cycle of the clock CLK, the delay stage number of the delay block 42 is n, and the delay number of the delay block 41 is 0. $K_T$ represents the slope of the delay time period-power supply voltage characteristic of the target circuit 10. n represents an initial delay stage number of the delay block 42.

The offset amount of the delay time period-power supply voltage characteristic of the delay circuit 40 is adjusted by determining the delay stage number N1 in accordance with expression (2) after the delay stage number N2 of the delay block 42 is determined.

$$N1 = \tau / t_0 \quad (2)$$

Herein, $\tau$ represents the minimum offset amount which is required for the input and output characteristic of the frequency-voltage conversion circuit 21 to be located upstream with respect to a characteristic of the target circuit 10 in a prescribed frequency range. $t_0$ represents the delay time period of the delay block 41 per stage.

As described above, the power management circuit 20 includes the frequency-voltage conversion circuit 21 adaptable to the target circuit 10 having arbitrary characteristics. This means that the power management circuit 20 can be provided as a core of a power management circuit for supplying the optimum operating voltage $V_{OP}$ in accordance with the target circuit 10.

Figure 19:
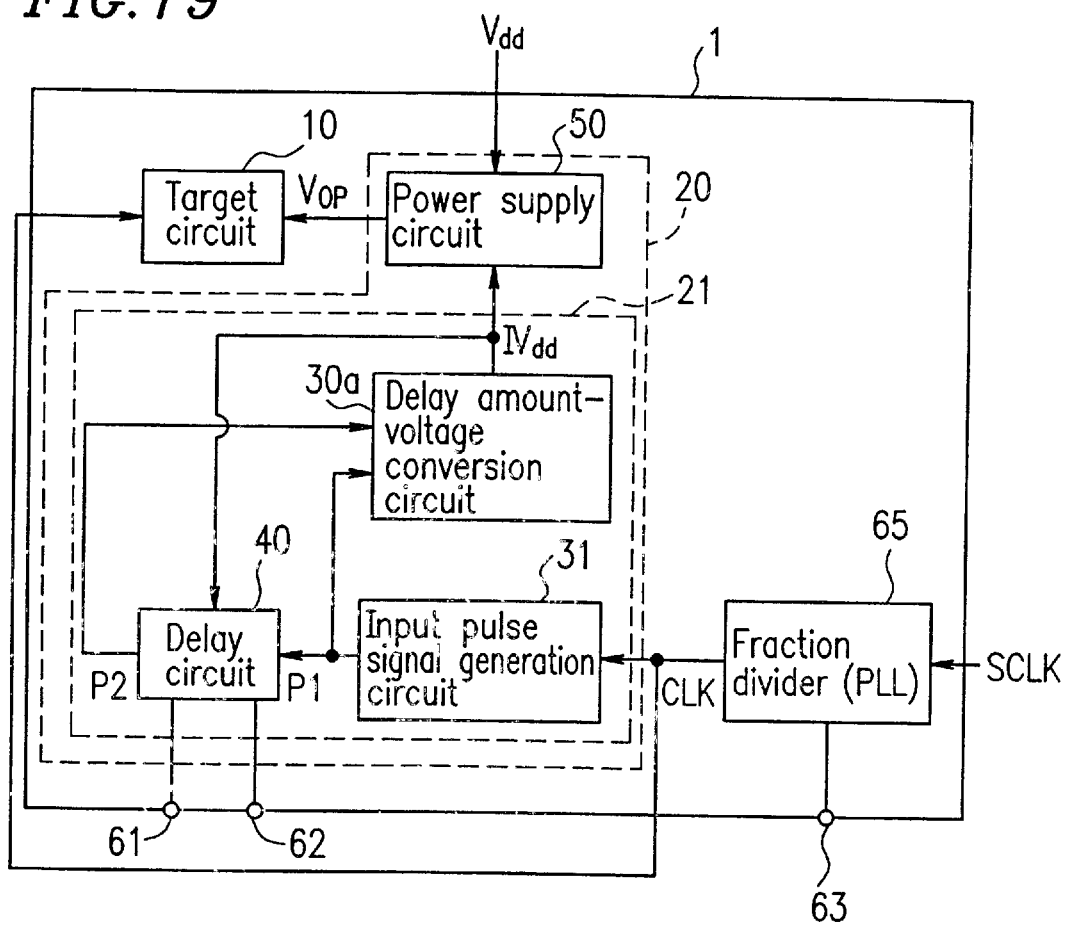
FIG. 19 is a view showing the system 1 in the case where a power management circuit 20 is used as a core of a power management circuit.

FIG. 19 shows a structure of the system 1 in the case where the power management circuit 20 is used as a core of the power management circuit. The system 1 includes a fraction divider (PLL) 65 in addition to the elements shown in FIG. 17. To the fraction divider (PLL) 65, a control signal for setting an integral multiple is input through a terminal 63.

The fraction divider (PLL) 65 generates an internal clock CLK by multiplying a system clock SCLK by the integral multiple. The internal clock CLK is supplied to the target circuit 10 and the input pulse signal generation circuit 31. The frequency of the internal clock CLK is changed by changing the integral multiple which is set in the fraction divider (PLL) 65. Thus, the operating frequency of the target circuit 10 can be controlled.

The optimum frequency-power supply voltage characteristic for the target circuit 10 can be realized by adjusting the delay stage number of the delay circuit 40 as described above.

In the above-described first example, a method for adjusting the input and output characteristic of the frequency-voltage conversion circuit 21 is described under the assumption that there is only one maximum delay path (critical path) regarding the target circuit 10. However, in actual LSIs, the critical path of the target circuit 10 can be changed in accordance with the power supply voltage. For example, in many LSIs having a complicated gate structure in which a RAM, ROM and the like are integrated into one chip, the critical path of the target circuit 10 changes in accordance with the power supply voltage.

There are various types of delay paths of the target circuit 10. For example, there is a delay path generated by a certain stage number of the gates, and a delay path generated in a RAM or ROM by wiring delay.

One type of gate, such as a multiple-input NAND, causes the delay amount, when the power supply voltage is lowered, to become larger than that of a normal gate.

Thus, in actual LSIs, the target circuit 10 can have a plurality of critical paths with respect to each power supply voltage.

Hereinafter, with reference to FIGS. 20A through 20E, a principle for adjusting the input and output characteristic of the frequency-voltage conversion circuit 21 in the case where the target circuit 10 has a plurality of critical paths depending on the power supply voltage will be discussed.

Figure 20A:
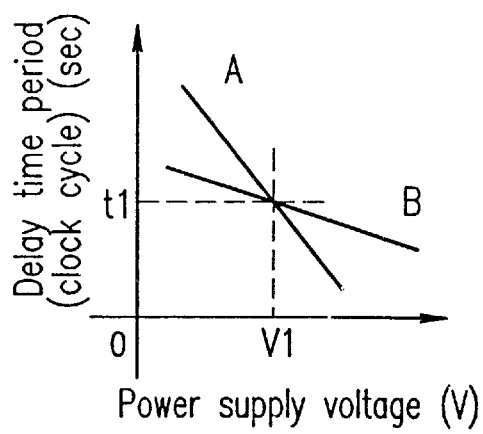
FIGS. 20A through 20E are views explaining a principle for adjusting the input and output characteristic of a frequency-voltage conversion circuit 21 in the case where the target circuit 10 has a plurality of critical paths depending on power supply voltages.

In FIG. 20A, straight line A represents the delay time period-power supply voltage characteristic corresponding to a first critical path of the target circuit 10. Straight line B represents the delay time period-power supply voltage characteristic corresponding to a second critical path of the target circuit 10. A delay time period-power supply voltage characteristic is generally represented with a curve. Herein, however, the delay time period-power supply voltage characteristics are approximated by the straight lines since any curve can be approximated by an appropriate number of straight lines.

Figure 20B:
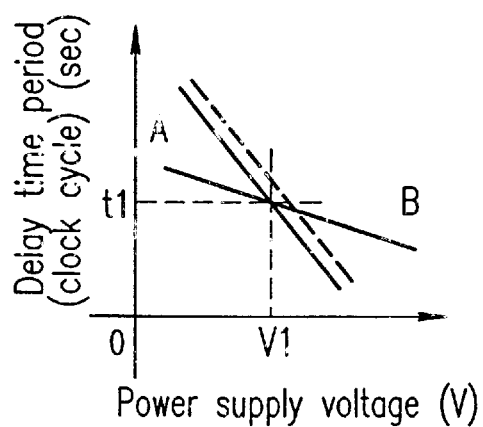

It is possible to adjust the stage number of the delay units included in the delay circuit 40 so that the delay time period-power supply voltage characteristic of the delay circuit 40 (FIG. 17) substantially matches straight line A using the frequency-voltage conversion circuit 21 (FIG. 17). In FIG. 20B, the dashed line represents the delay time period-power supply voltage characteristic of the delay circuit 40 which is adjusted in this manner. However, according to such an adjustment, the target circuit 10 malfunctions due to the second critical path in a range in which the delay time period (=clock cycle) is shorter than time period t1.

Figure 20C:
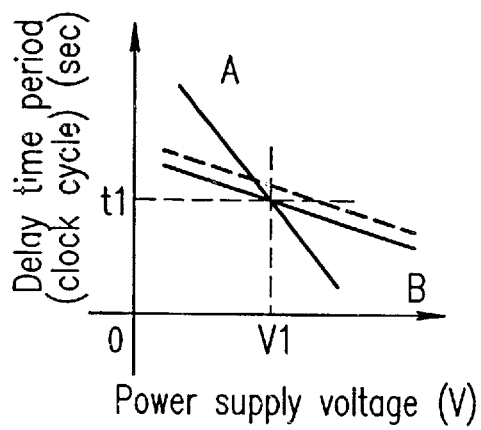

Similarly, it is possible to adjust the stage number of the delay units included in the delay circuit 40 so that the delay time period-power supply voltage characteristic of the delay circuit 40 (FIG. 17) substantially matches straight line B using the frequency-voltage conversion circuit 21 in FIG. 17. In FIG. 20C, the dashed line represents the delay time period-power supply voltage characteristic of the delay circuit 40 which is adjusted in this manner. However, according to such an adjustment, the target circuit 10 malfunctions due to the first critical path in a range in which the delay time period (=clock cycle) is longer than time period t1.

Figure 20D:
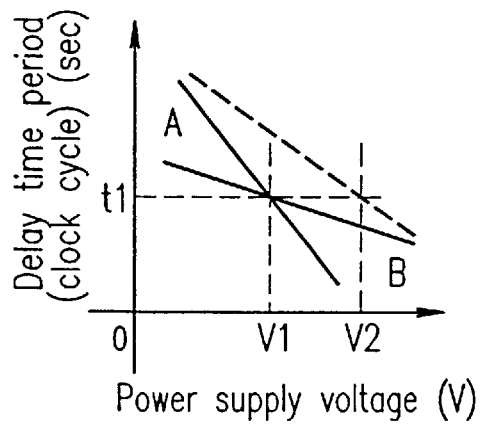

In order to ensure that the target circuit 10 operates normally with respect to all the clock cycles at which the target circuit 10 is operable, the delay time period-power supply voltage characteristic indicated by the dashed line in FIG. 20D needs to be realized. Such delay time period-power supply voltage characteristic can be realized using the frequency-voltage conversion circuit 21 (FIG. 17). However, according to the delay time period-power supply voltage characteristic shown in FIG. 20D, the power supply voltage V2 which is unnecessarily large with respect to the clock cycle t1 is given to the target circuit 10. As a result, power is wastefully consumed.

Figure 20E:
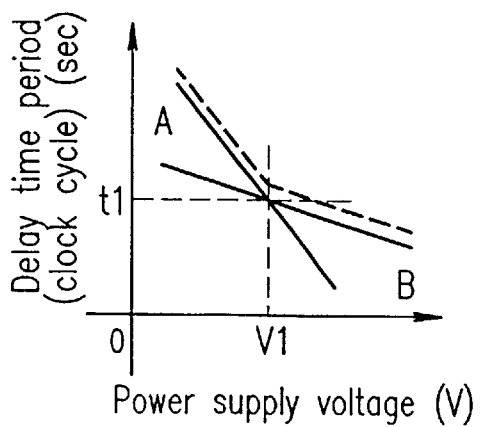

In order to ensure that the target circuit 10 operates normally with respect to all the clock cycles at which the target circuit 10 is operable while preventing wasteful power consumption, the delay time period-power supply voltage characteristic indicated by the dashed line in FIG. 20E needs to be realized.

Figure 21:
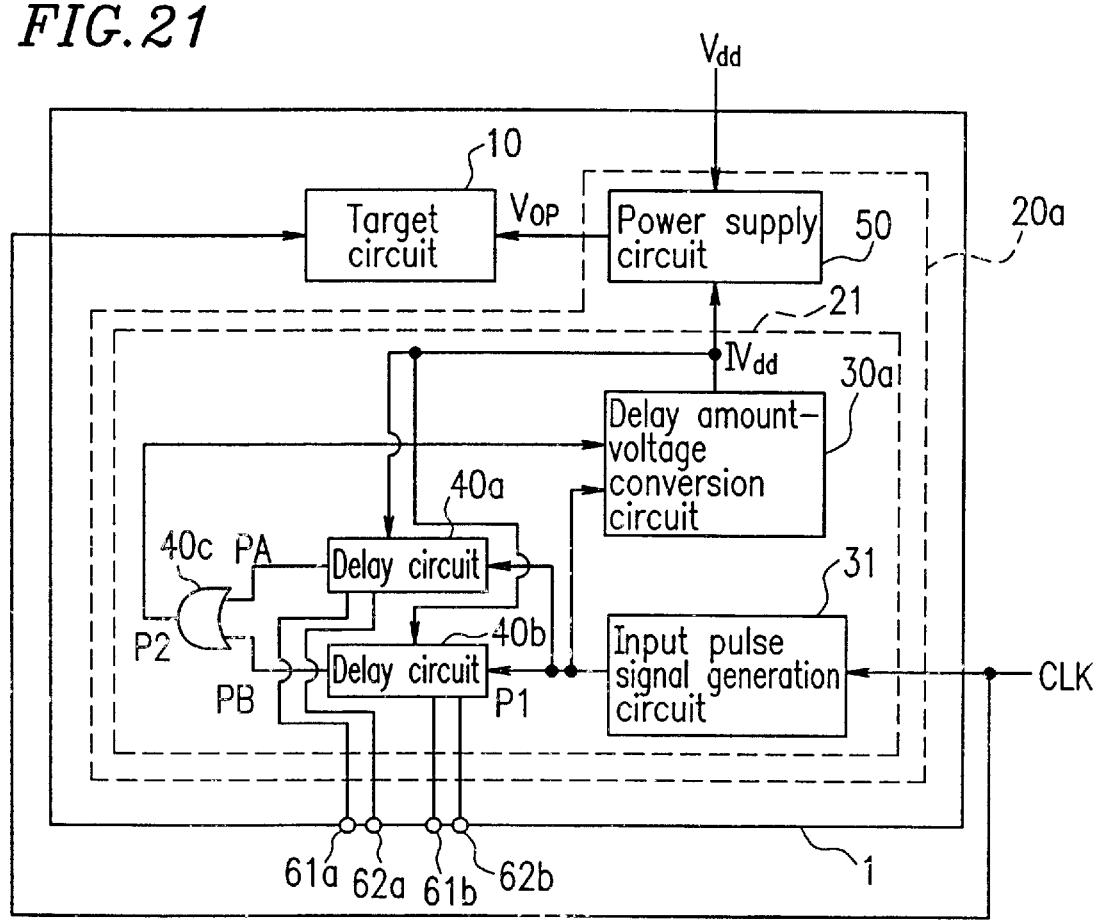
FIG. 21 is a view showing a structure of a modification of the frequency-voltage conversion circuit 21.

FIG. 21 shows a modification of the frequency-voltage conversion circuit 21 (FIG. 17). The frequency-voltage conversion circuit 21 shown in FIG. 21 realizes the delay time period-power supply voltage characteristic indicated by the dashed line in FIG. 20E.

The frequency-voltage conversion circuit 21 shown in FIG. 21 includes a delay circuit 40*a*, a delay circuit 40*b* and an OR circuit 40*c* in lieu of the delay circuit 40. The structure of the delay circuits 40*a* and 40*b* are identical to the structure of the delay circuit 40. Regarding the structure of the delay circuit 40, refer to FIG. 3.

The delay time period-power supply voltage characteristic of the delay circuit 40*a* is adjusted in advance so as to substantially match straight line A shown in FIG. 20A. Such an adjustment is achieved by inputting a control signal to the delay circuit 40*a* through terminals 61*a* and 62*a*. The delay time period-power supply voltage characteristic of the delay circuit 40*b* is adjusted in advance so as to substantially match straight line B shown in FIG. 20A. Such an adjustment is achieved by inputting a control signal to the delay circuit 40*b* through terminals 61*b* and 62*b*. Thus, the delay time period-power supply voltage characteristic of the delay circuit 40*a* and the delay time period-power supply voltage characteristic of the delay circuit 40*b* can be adjusted independently from each other.

The input pulse signal generation circuit 31 generates an input pulse signal having a pulse width representing a target delay amount. Herein, the target delay amount is equal to a reciprocal of the frequency of the clock CLK (i.e., the length of one cycle of the clock CLK=clock cycle). The input pulse signal P1 is input to the delay circuits 40*a* and 40*b*.

The delay circuit 40*a* delays the input pulse signal P1 in accordance with the voltage $IV_{dd}$ which is output from the delay amount-voltage conversion circuit 30*a*. The input signal pulse P1 delayed by the delay circuit 40*a* is output to the OR circuit 40*c* as an output pulse signal PA.

The delay circuit 40*b* delays the input pulse signal P1 in accordance with the voltage $IV_{dd}$ which is output from the delay amount-voltage conversion circuit 30*a*. The input signal pulse P1 delayed by the delay circuit 40*b* is output to the OR circuit 40*c* as an output pulse signal PB.

The OR circuit 40*c* calculates an OR of the output pulse signal PA and the output pulse signal PB, and outputs the result to the delay amount-voltage conversion circuit 30*a* as the output pulse signal P2.

The delay amount-voltage conversion circuit 30*a* feedback-controls the minimum voltage $IV_{dd}$ so that the rising edge of the input pulse signal P1 and the falling edge of the output pulse signal P2 substantially match each other as described with reference to FIGS. 8A through 8C.

Figure 22A:
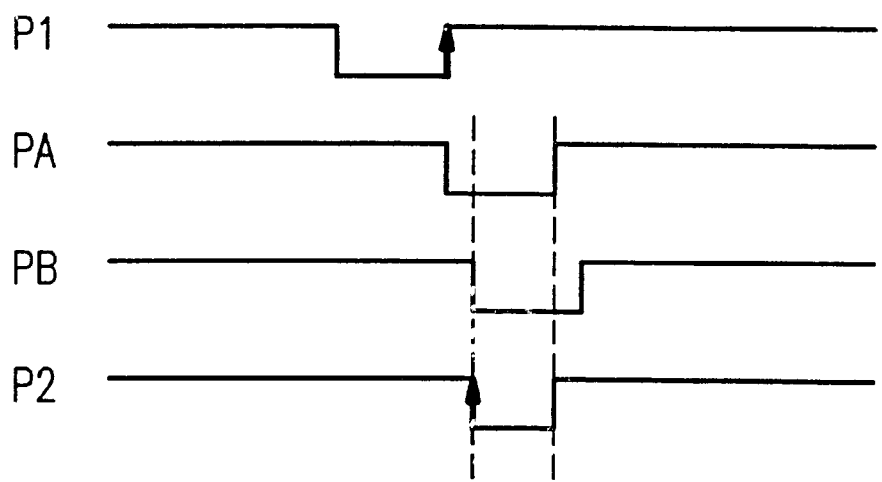
FIGS. 22A through 22B are views showing waveforms of the input pulse signal P1, output pulse signal PA, output pulse signal PB, and output pulse signal P2.

FIG. 22A shows waveforms of pulse signals in the case where the clock cycle is shorter than time period t1. When the clock cycle is shorter than time period t1, straight line B represents the critical path as shown in FIG. 20A. Accordingly, the delay amount by the delay circuit 40*b* is larger than the delay amount by the delay circuit 40*a*. As a result, the falling edge of the output pulse signal P2 matches the falling edge of the output pulse signal PB.

Figure 22B:
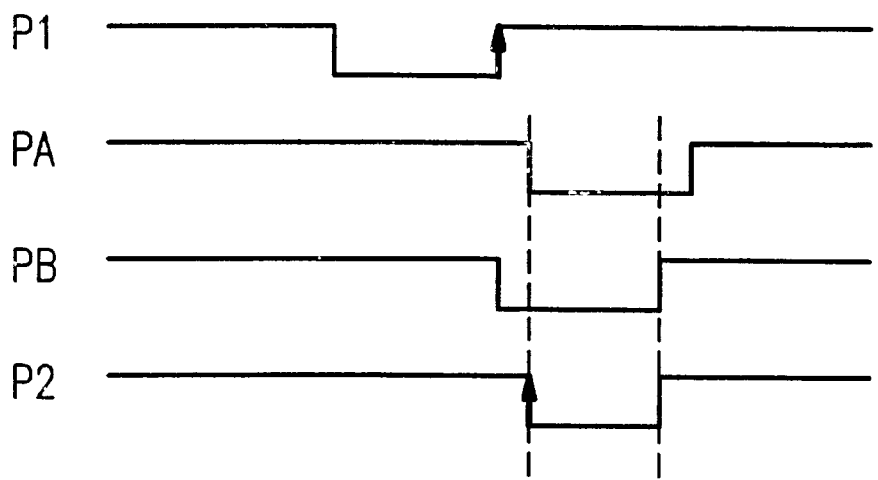

FIG. 22B shows waveforms of pulse signals in the case where the clock cycle is longer than time period t1. When the clock cycle is longer than time period t1, straight line A represents the critical path as shown in FIG. 20A. Accordingly, the delay amount by the delay circuit 40*a* is larger than the delay amount by the delay circuit 40*b*. As a result, the falling edge of the output pulse signal P2 matches the falling edge of the output pulse signal PA.

Thus, when the clock cycle is shorter than time period t1, the minimum voltage $IV_{dd}$ is feedback-controlled so that the rising edge of the input pulse signal P1 and the falling edge of the output pulse signal PB match each other. When the clock cycle is longer than time period t1, the minimum voltage $IV_{dd}$ is feedback-controlled so that the rising edge of the input pulse signal P1 and the falling edge of the output pulse signal PA match each other. Such a control realizes the delay time period-power supply voltage characteristic indicated by the dashed line in FIG. 20E.

In this manner, with the frequency-voltage conversion circuit 21 shown in FIG. 21, the delay time period-power supply voltage characteristics of the delay circuits 40*a* and 40*b* can be adjusted so as to substantially match the delay time period-power supply voltage characteristic obtained by synthesizing the delay time period-power supply voltage characteristic corresponding to two different types of critical paths. This means that the input and output characteristic of the frequency-voltage conversion circuit 21 can be adjusted so as to correspond to the synthesized delay time period-power supply voltage characteristic. Accordingly, even when the target circuit 10 has two different types of critical paths, the frequency-voltage conversion circuit 21 can output the minimum voltage in accordance with the frequency of the clock CLK to the target circuit 10.

Even when the target circuit 10 has three or more critical paths, the frequency-voltage conversion circuit 21 can output the minimum voltage in accordance with the frequency of the clock CLK to the target circuit 10. When the target circuit 10 has three or more critical paths, three or more delay circuits corresponding to the three or more critical paths are arranged parallel, and an OR of the outputs from the delay circuits is input to the delay amount-voltage conversion circuit 30a.

EXAMPLE 2

Figure 23:
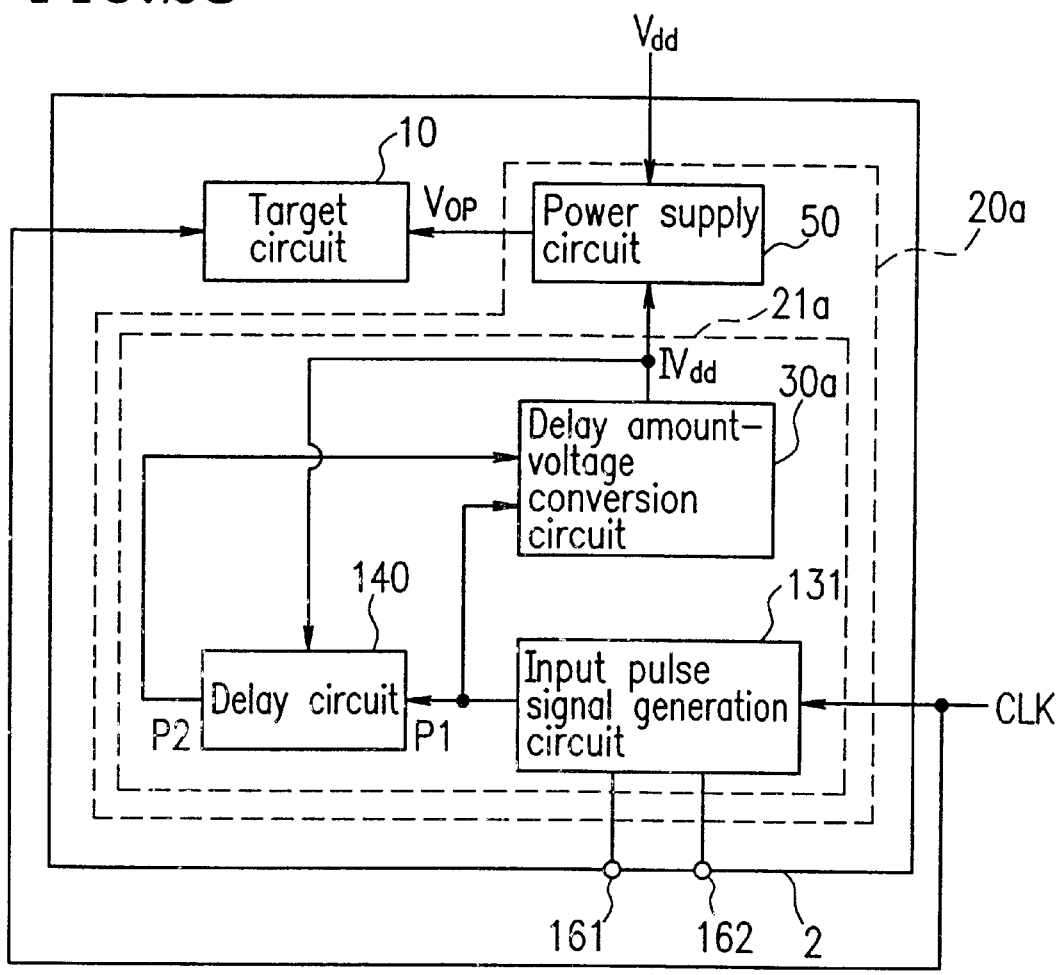
FIG. 23 is a view showing a structure of a modification of a system 2 in a second example according to the present invention.

FIG. 23 shows a structure of a system 2 in a second example according to the present invention. Identical elements as those of the system 1 shown in FIG. 17 bear identical reference numerals.

The system 2 includes a target circuit 10 and a power management circuit 20a for supplying a minimum operating voltage $V_{OP}$ required for the target circuit 10 to operate at the frequency of a clock. The system 2 can be formed on a single semiconductor chip.

The target circuit 10 can be, for example, a digital signal processor (DSP) or a central processing unit (CPU). The target circuit 10 operates in accordance with a clock CLK.

The power management circuit 20a includes a frequency-voltage conversion circuit 21a and a power supply circuit 50.

The frequency-voltage conversion circuit 21a receives a clock CLK as an input and provides a voltage $IV_{dd}$ in accordance with the frequency of the clock CLK as an output. The frequency-voltage conversion circuit 21a is structured so that the input and output characteristic thereof are adjustable based on two independent parameters. One of the two parameters is the slope of the frequency-voltage conversion circuit 21a, and the other is the offset amount of the frequency-voltage conversion circuit 21a. The input and output characteristic of the frequency-voltage conversion circuit 21a is adjusted so that the voltage $IV_{dd}$ output from the frequency-voltage conversion circuit 21a substantially matches the minimum voltage required for the target circuit 10 to operate at the frequency of the clock CLK.

The voltage $IV_{dd}$ output from the frequency-voltage conversion circuit 21a is supplied to the power supply circuit 50.

The power supply circuit 50 generates the operating voltage $V_{OP}$ based on the voltage $IV_{dd}$. For example, the power supply circuit 50 can be a voltage converter for converting the power supply voltage $V_{dd}$ to the operating voltage $V_{OP}$ with the minimum voltage $IV_{dd}$ being the target voltage. Such a voltage converter is preferably a DC/DC converter for converting a DC power supply voltage $V_{dd}$ (e.g., 3 V) to a DC operating voltage $V_{OP}$ at a high efficiency (e.g., 95%) in order to reduce the power consumption of the entirety of the power management circuit 20. Alternatively, the power supply circuit 50 can be an operational amplifier.

However, it is not indispensable that the power supply circuit 50 is included in the power management circuit 20.

In lieu of generating the operating voltage $V_{OP}$ based on the voltage $IV_{dd}$, the voltage $IV_{dd}$ output from the frequency-voltage conversion circuit 21a can be supplied to the target circuit 10 as the operating voltage $V_{OP}$.

The frequency-voltage conversion circuit 21a includes an input pulse signal generation circuit 131, a delay circuit 140 and a delay amount-voltage conversion circuit 30a.

The input pulse signal generation circuit 131 intermittently generates input pulse signal P1 in accordance with the frequency of the input pulse signal generation circuit 131. The input pulse signal P1 has a pulse width representing a target delay amount. The pulse width of the input pulse signal P1 is determined as a function of the frequency of the clock CLK. The function is defined by expression (3).

$$Pw=\alpha/f+\beta \qquad (3)$$

Herein, Pw represents the pulse width of the input pulse signal P1, f represents the frequency of the clock CLK, and $\alpha$ and $\beta$ represent constants. As described below, the slope of the input and output characteristic of the frequency-voltage conversion circuit 21a is adjusted by adjusting the value of the constant $\alpha$, and the offset amount of the input and output characteristic of the frequency-voltage conversion circuit 21a is adjusted by adjusting the value of the constant $\beta$.

A control signal for adjusting the value of the constant $\alpha$ is input through a terminal 161. A control signal for adjusting the value of the constant $\beta$ is input through a terminal 162.

To the delay circuit 140, the $IV_{dd}$ which is output from the frequency-voltage conversion circuit 21a is supplied. The delay circuit 140 delays the input pulse signal P1 in accordance with the voltage $IV_{dd}$. The output from the delay circuit 140 is supplied to the delay amount-voltage conversion circuit 30a as the output pulse signal P2. The delay circuit 140 can include, for example, a plurality of delay units connected in series. However, unlike the delay circuit 40 in the first example, it is not necessary to control the stage number of delay units, among the plurality of delay units by a delay control circuit, through which the input pulse signal P1 passes. The reason for this is in the second example, the input and output characteristic of the frequency-voltage conversion circuit 21a can be adjusted by adjusting the value of the constants $\alpha$ and $\beta$ used to determine the pulse width of the input pulse signal P1.

The delay amount-voltage conversion circuit 30a outputs the voltage $IV_{dd}$ in accordance with the delay amount of the output pulse signal P2 with respect to the input pulse signal P1. The structure of the delay amount-voltage conversion circuit 30a is as shown in FIG. 18.

Hereinafter, with reference to FIGS. 24A and 25B, a principle for adjusting the input and output characteristic of the frequency-voltage conversion circuit 21a by adjusting the pulse width of the input pulse signal P1 will be described.

Figure 24A:
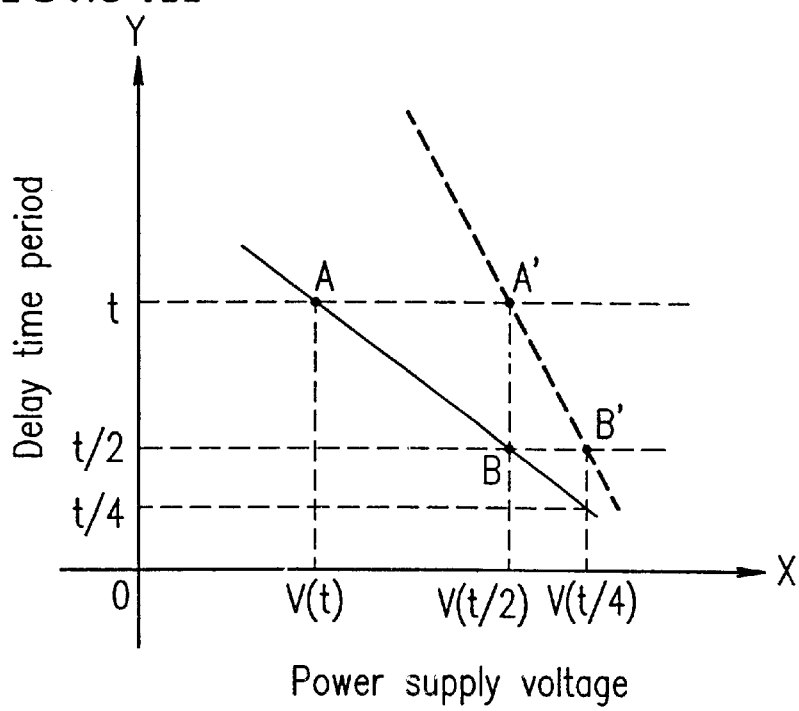
FIGS. 24A and 24B are views explaining a principle for adjusting the input and output characteristic of a frequency-voltage conversion circuit 21a by adjusting a pulse width of the input pulse signal P1.
Figure 24B:
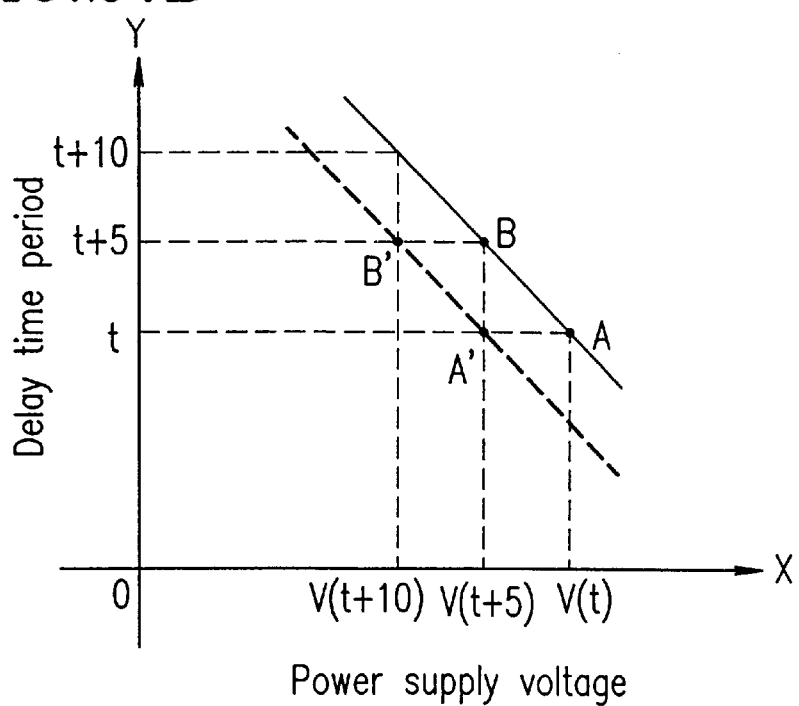

In FIGS. 24A and 24B, the solid line represents the initial delay time period-power supply voltage characteristic of the delay circuit 140. A delay time period-power supply voltage characteristic is generally represented by a hyperbola as shown in FIG. 4. However, in each of FIGS. 24A and 24B, the delay time period-power supply voltage characteristic is approximated by a straight line since any curve can be approximated by an appropriate number of straight lines. The delay circuit 140 operates with a shorter delay time period as the power supply voltage is higher, and operates with a longer delay time period as the power supply voltage is lower. The delay circuit 140 operates with the voltage $IV_{dd}$ as the power supply voltage.

Hereinafter, with reference to FIG. 24A, a principle for adjusting the slope of the delay time period-power supply voltage characteristic will be described.

In FIG. 24A, point A on the solid line represents that the power supply voltage corresponding to the target delay time period t is V(t). In other words, the coordinate of point A is (V(t), t). Point B on the solid line represents that the power supply voltage corresponding to the target delay time period t/2 is V(t/2). In other words, the coordinate of point B is (V(t/2), t/2). Accordingly, a slope $K_{AB}$ of the straight line (solid line) connecting point A and B is found by expression (4).

$$K_{AB}=(t/2-t)/\{V(t/2)-V(t)\} \tag{4}$$

In FIG. 24A, by converting the delay time period—power supply voltage characteristic of the delay circuit 140 so that the power supply voltage corresponding to the target delay time period t is V(t/2), the converted delay time period—power supply voltage characteristic of the delay circuit 140 is obtained. The converted delay time period—power supply voltage characteristic is indicated by the dashed line in FIG. 24A. Such a conversion is achieved by inputting an input pulse signal P1 having a pulse width t/2 with respect to the target delay time period t to the delay circuit 140. Such a conversion converts point A to point A' and converts point B to point B'.

Point A' on the dashed line represents that the power supply voltage corresponding to the target delay time period t is V(t/2). In other words, the coordinate of point A' is (V(t/2), t). Point B' on the dashed line represents that the power supply voltage corresponding to the target delay time period t/2 is V(t/4). In other words, the coordinate of point B' is (V(t/4), t/2). Accordingly, a slope $K_{A'B'}$ of the straight line (dashed line) connecting point A' and point B' is found by expression (5).

$$\begin{aligned} K_{A'B'} &= (t/2-t)/\{V(t/4)-V(t/2)\} \\ &= (t/2-t)/\{(1/2)\{V(t/2)-V(t)\} \\ &= 2 \cdot K_{AB} \end{aligned} \tag{5}$$

In this manner, by inputting an input pulse signal P1 having a pulse width t/2 with respect to the target delay time period t to the delay circuit 140, the slope of the converted delay time period—power supply voltage characteristic of the delay circuit 140 becomes twice the slope of the initial delay time period—power supply voltage characteristic of the delay circuit 140. Similarly, by inputting an input pulse signal P1 having a pulse width t/3 with respect to the target delay time period t to the delay circuit 140, the slope of the converted delay time period —power supply voltage characteristic of the delay circuit 140 can be made three times the slope of the initial delay time period—power supply voltage characteristic of the delay circuit 140.

Hereinafter, with reference to FIG. 24B, a principle for adjusting the offset amount of the delay time period—power supply voltage characteristic will be described.

In FIG. 24B, point A on the solid line represents that the power supply voltage corresponding to the target delay time period t is V(t). In other words, the coordinate of point A is (V(t), t). Point B on the solid line represents that the power supply voltage corresponding to the target delay time period (t+5) is V(t+5). In other words, the coordinate of point B is (V(t+5), t+5).

In FIG. 24B, by converting the delay time period —power supply voltage characteristic of the delay circuit 140 so that the power supply voltage corresponding to the target delay time period t is V(t+5), the converted delay time period—power supply voltage characteristic of the delay circuit 140 is obtained. The converted delay time period—power supply voltage characteristic is indicated by the dashed line in FIG 24B. Such a conversion is achieved by inputting an input pulse signal P1 having a pulse width (t+5) with respect to the target delay time period t to the delay circuit 140. Such a conversion converts point A to point A' and converts point B to point B'.

Point A' on the dashed line represents that the power supply voltage corresponding to the target delay time period t is V(t+5). In other words, the coordinate of point A' is (V(t+5), t). Point B' on the dashed line represents that the power supply voltage corresponding to the target delay time period (t+5) is V(t+10). In other words, the coordinate of point B' is (V(t+10), t+5).

In this manner, by inputting an input pulse signal P1 having a pulse width (t+5) with respect to the target delay time period t to the delay circuit 140, the delay time period—power supply voltage characteristic of the delay circuit 140 is moved parallel along the Y axis by −5 (nsec.). Similarly, by inputting an input pulse signal P1 having a pulse width (t−10) with respect to the target delay time period t to the delay circuit 140, the delay time period —power supply voltage characteristic of the delay circuit 140 can be moved parallel along the Y axis by +10 (nsec.). The moving distance of the delay time period—power supply voltage characteristic along the Y axis is referred to an offset amount of the delay time period—power supply voltage characteristic.

Thus, the pulse width Pw of the input pulse signal P1 is given by expression (6).

$$Pw=\alpha \cdot t+\beta \tag{6}$$

Herein, $\alpha$ and $\beta$ are each an arbitrary constant. The slope of the delay time period—power supply voltage characteristic of the delay circuit 140 is adjusted by adjusting the constant $\alpha$. The offset amount of the delay time period—power supply voltage characteristic of the delay circuit 140 is adjusted by adjusting the constant $\beta$. The input pulse signal P1 having the pulse width Pw is generated by the input pulse signal generation circuit 131.

Where f is the frequency of the clock CLK, t=1/f. Accordingly, it is understood that expression (3) and expression (6) are equivalent to each other.

In the second example, adjustment of the slope of the delay time period—power supply voltage characteristic of the delay circuit 140 using the constant $\alpha$ means adjustment of the slope of the input and output characteristic of the frequency-voltage conversion circuit 21*a*. The reason for this is that power supply voltage of the delay circuit 140 is equal to the voltage $IV_{dd}$, and the delay time period by the delay circuit 140 and the frequency of the clock CLK are reciprocal to each other. In a similar sense, adjustment of the offset amount of the delay time period—power supply voltage characteristic of the delay circuit 140 using the constant $\beta$ means adjustment of the offset amount of the input and output characteristic of the frequency-voltage conversion circuit 21*a*. Thus, the frequency-voltage conversion circuit 21*a* provides one embodiment of the frequency-voltage conversion circuit which is structured to make the slope and offset amount of the input and output characteristic thereof adjustable.

Figure 25:
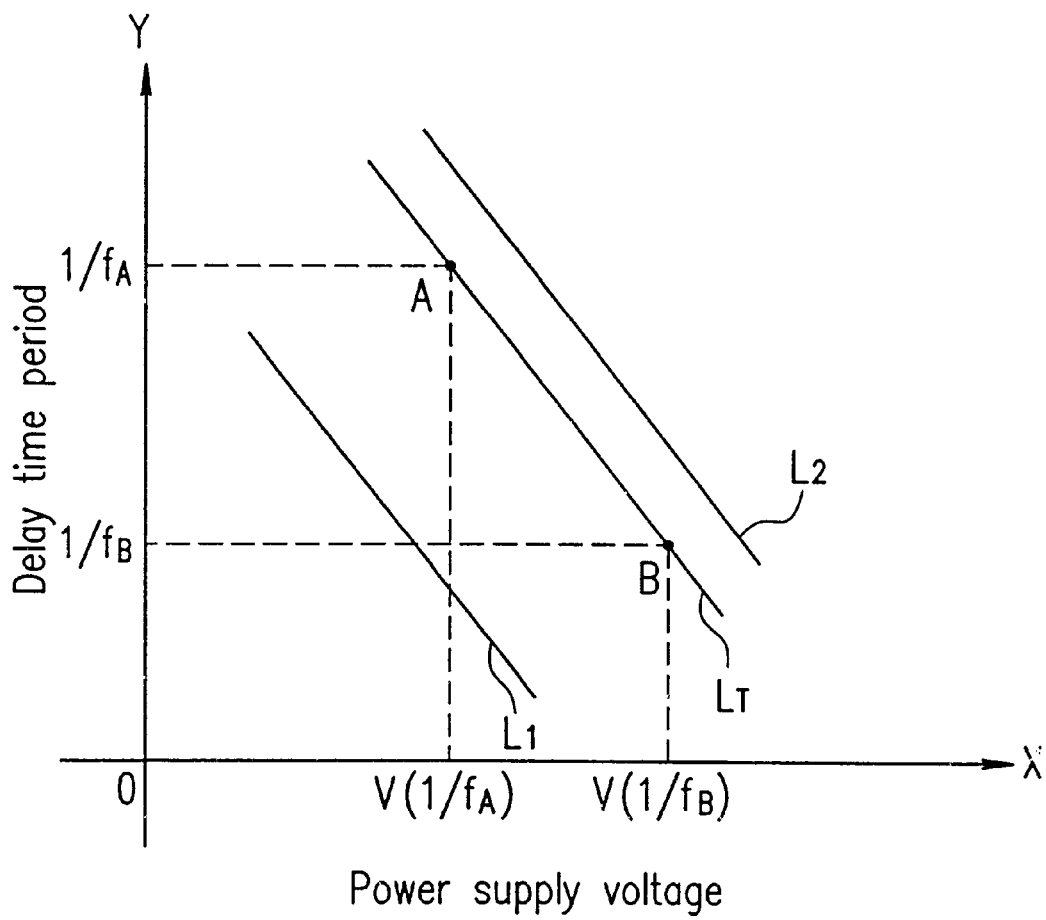

Hereinafter, with reference to FIG. 25, a method for adjusting the input and output characteristic of the frequency-voltage conversion circuit 21a so that the voltage $IV_{dd}$ which is output from the frequency-voltage conversion circuit 21a in accordance with the frequency of the clock CLK substantially matches the minimum voltage required for the target circuit 10 to be operable at the frequency of the clock CLK will be described.

Step 1: The slope of the characteristic of the target circuit 10 is obtained. The slope of the characteristic of the target circuit 10 can be obtained by measuring minimum power supply voltages required for the target circuit 10 to operate with respect to at least two operating frequencies of the clock CLK; plotting the measured points on a graph illustrating the delay time period —power supply voltage characteristic; and obtaining the slope of the straight line connecting the measured points. For example, it is assumed that a voltage $V(1/f_A)$ is measured as the minimum power supply voltage for the target circuit 10 to operate at the frequency $f_A$ of the clock CLK, and a voltage $V(1/f_B)$ is measured as the minimum power supply voltage for the target circuit 10 to operate at the frequency $f_B$ of the clock CLK. In this case, FIG. 25 is obtained by plotting point A having the coordinate $(V(1/f_A), 1/f_A)$ and point B having the coordinate $(V(1/f_B), 1/f_B)$ on the graph illustrating the delay time period—power supply voltage characteristic. In FIG. 25, straight line $L_T$ represents the characteristic of the target circuit 10. The slope $K_{TAB}$ of the characteristic of the target circuit 10 is found in accordance with expression (7).

$$K_{TAB}=(1/f_A-1/f_B)/\{(V(1/f_A)-V(1/f_B)\} \quad (7)$$

Step 2: The input and output characteristic of the frequency-voltage conversion circuit 21a is adjusted so that the slope K of the input and output characteristic of the frequency-voltage conversion circuit 21a substantially matches the slope $K_{TAB}$ of the characteristic of the target circuit 10. For example, the input and output characteristic of the frequency-voltage conversion circuit 21a can be adjusted so as to fulfill expression (8).

$$|K-K_{TAB}|<\epsilon \quad (8)$$

Herein, $\epsilon$ is a constant representing a target value of the absolute value of the error between the slope K of the input and output characteristic of the frequency-voltage conversion circuit 21a and the slope $K_{TAB}$ of the characteristic of the target circuit 10.

Such an adjustment is achieved by determining the pulse width Pw of the input pulse signal P1 in accordance with expression (9). In FIG. 25, straight line $L_1$ represents an example of the input and output characteristic of the frequency-voltage conversion circuit 21a after the slope K is adjusted.

$$Pw=(K_{INIT}/K_{TAB})\cdot t \quad (9)$$

Herein, $K_{INIT}$ represents the slope of the initial delay time period—power supply voltage characteristic of the delay circuit 140 in the case where the pulse width Pw of the input pulse signal P1 is equal to one cycle of the clock CLK, $K_{TAB}$ represents the slope of the characteristic of the target circuit 10. t represents a reciprocal of the frequency f of the clock CLK (i.e., 1/f).

Step 3: The offset amount of the input and output characteristic of the frequency-voltage conversion circuit 21a is adjusted so that the target circuit 10 is operable within a prescribed frequency range of the clock CLK. Such an adjustment is achieved by determining the pulse width Pw of the input pulse signal P1 in accordance with expression (10).

$$Pi\ Pw=(K_{INIT}/K_{TAB})\cdot t-\tau \quad (10)$$

Herein, $\tau$ represents the slope of the minimum offset amount required for the input and output characteristic of the frequency-voltage conversion circuit 21a to be located upstream with respect to the characteristic of the target circuit 10 in a prescribed frequency range. In other words, when the prescribed frequency range is $f_{min}$ or more and $f_{max}$ or less, the offset amount $\tau$ is determined so as to fulfill expression (11) and to minimize $V_{L2}$ (y).

$$V_{LT}(y)\leq V_{L2}(y)\ (f_{min}\leq y\leq f_{max}) \quad (11)$$

Herein, $V_{LT}$ represents a function $x=V_{LT}(y)$ indicating the characteristic of the target circuit 10, and $V_{L2}$ represents a function $x=V_{L2}(y)$ indicating the input and output characteristic of the frequency-voltage conversion circuit 21a. In FIG. 25, straight line $L_2$ shows an example of the input and output characteristic of the frequency-voltage conversion circuit 21a after the slope K and the offset amount $\tau$ are adjusted.

From $K_{INIT}/K_{TAB}=\alpha$, and $-\tau=\beta$, it is understood that expression (10) and expression (6) are equivalent to each other.

The adjustment of the pulse width Pw of the input pulse signal P1 and the adjustment of the stage number of the delay units included in the delay circuit described in the first example can be used in combination. In this manner, it is possible to substantially match the input and output characteristic of the frequency-voltage conversion circuit 21a to the characteristic of the target circuit 10.

As described above, the power management circuit 20a includes the frequency-voltage conversion circuit 21a adaptable to the target circuit 10 having arbitrary characteristics. This means that the power management circuit 20a can be provided as a core of a power management circuit for supplying the optimum operating voltage in accordance with the target circuit 10.

Figure 26:
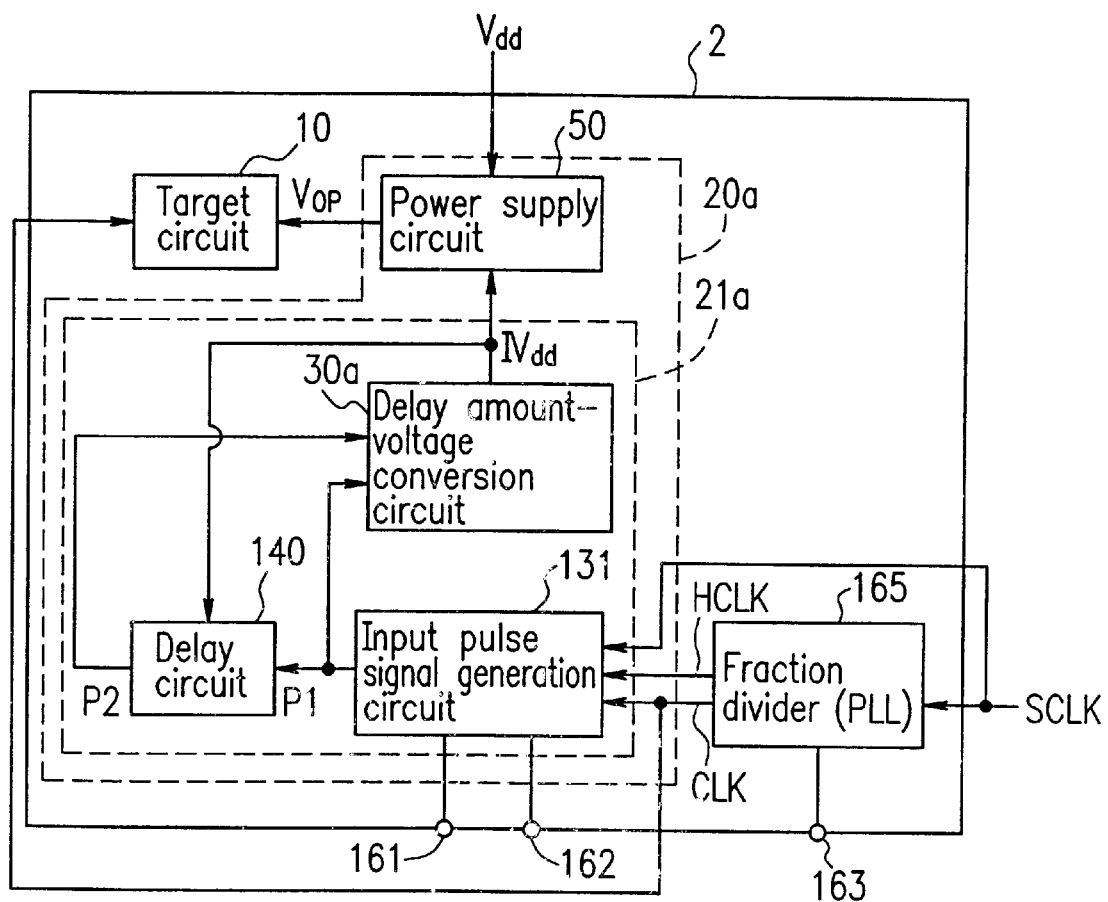
FIG. 26 is a view showing a structure of the system 2 in the case where a power management circuit 20a is used as a core of the power management circuit.

FIG. 26 shows a structure of the system 2 in the case where the power management circuit 20a is used as a core of the power management circuit. The system 2 includes a fraction divider (PLL) 165 in addition to the elements shown in FIG. 23. To the fraction divider (PLL) 165, a control signal for setting an integral multiple is input through a terminal 163.

The fraction divider (PLL) 165 generates an internal clock CLK by multiplying a system clock SCLK by the integral multiple. The internal clock CLK is supplied to the target circuit 10 and the input pulse signal generation circuit 131. The frequency of the internal clock CLK is changed by changing the integral multiple which is set in the fraction divider (PLL) 165. Thus, the operating frequency of the target circuit 10 can be controlled.

The fraction divider (PLL) 165 supplies the input pulse signal generation circuit 131 with the highest clock HCLK which is output from a VCO (not shown) included in the fraction divider (PLL) 165. In this system, the clock CLK is a clock obtained by dividing the clock HCLK. Using the clocks CLK and HCLK, the value of the constant $\alpha$ can be adjusted in the input pulse signal generation circuit 131.

To the input pulse signal generation circuit 131, a system clock SCLK is input. The system clock SCLK is used to adjust the value of the constant $\beta$ in the input pulse signal generation circuit 131. The reason for this is that the system clock SCLK does not depend on the temperature or process.

The optimum frequency-power supply voltage characteristic for the target circuit 10 can be realized by adjusting the pulse width of the input pulse signal P1 using the above-described clocks.

Hereinafter, an apparatus 3 for automatically adjusting the input and output characteristic of the frequency-voltage conversion circuit 21a in the system 2 including the target circuit 10 and the frequency-voltage conversion circuit 21a will be described. The system 2 and the apparatus 3 can be formed on a single semiconductor chip.

The target circuit 10 operates in accordance with the clock CLK. The frequency-voltage conversion circuit 21a receives the clock CLK as an input and outputs the voltage $IV_{dd}$ in accordance with the frequency of the clock CLK as an output. The power supply circuit 50 supplies an operating voltage $V_{OP}$ for the target circuit 10 to the target circuit 10 in accordance with the voltage $IV_{dd}$. Alternatively, the voltage $IV_{dd}$ output from the frequency-voltage conversion circuit 21a can be supplied to the target circuit 10 as the operating voltage $V_{OP}$ for the target circuit 10.

Figure 27:
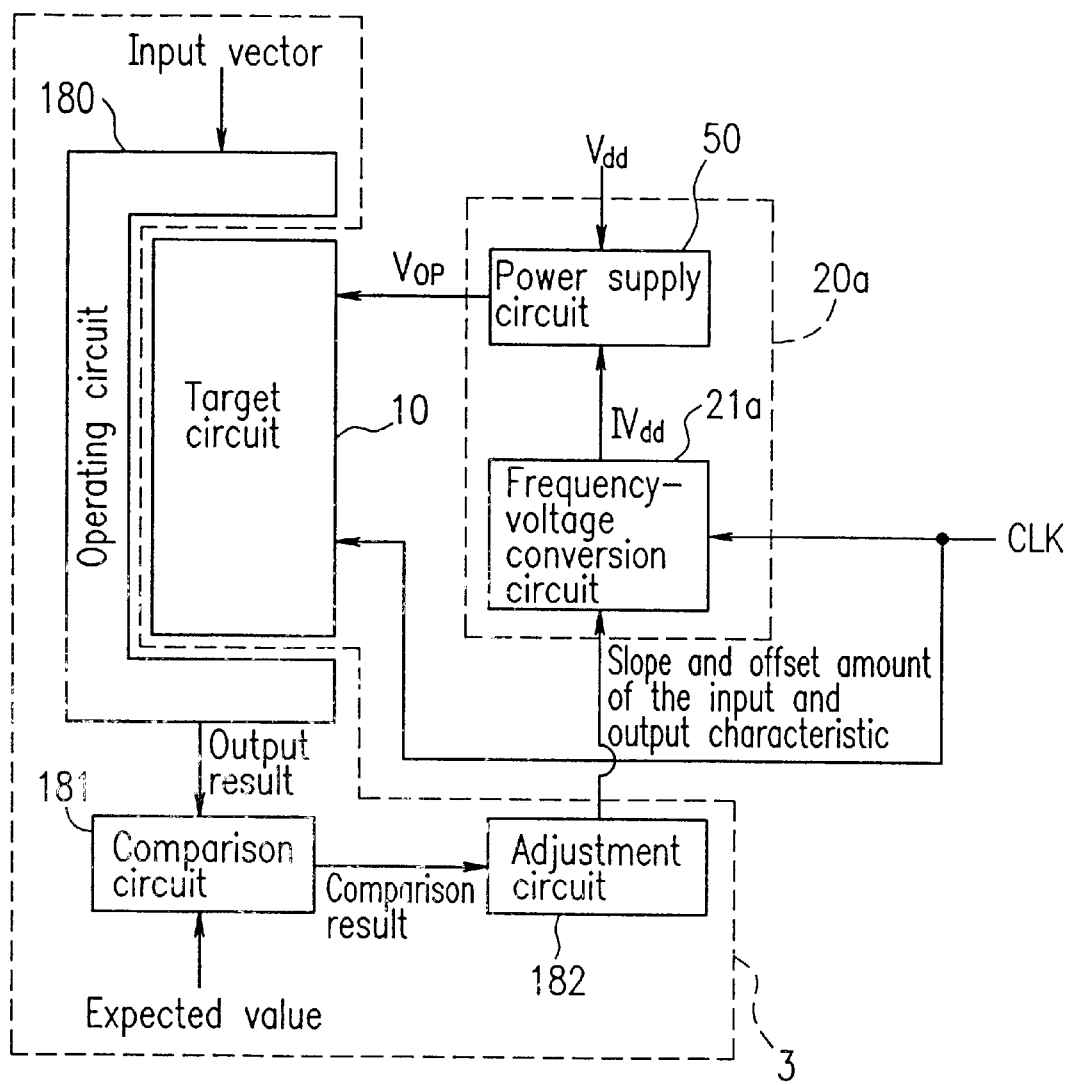

FIG. 27 shows a structure of the apparatus 3. The apparatus 3 includes an operating circuit 180, a comparison circuit 181 and an adjustment circuit 182.

The operating circuit 180 actually operates the target circuit 10 with respect to an input vector at the frequency of the clock CLK and outputs the operation result. As the input vector, an input vector for realizing a maximum delay path is used.

The comparison circuit 181 compares the operation result of the target circuit 10 with an expected value and outputs the comparison result. The expected value is stored in a memory (not shown) in advance based on the operation specifications of the target circuit 10. The comparison result is expressed as either normal (OK) or abnormal (NG).

Thus, the operating circuit 180 and the comparison circuit 181 have a self-diagnosis function of determining whether or not the target circuit 10 has operated normally regarding the relationship between the operating voltage $V_{OP}$ of the target circuit 10 and the frequency of the clock CLK.

When the comparison result indicates a normal operation (OK), the adjustment circuit 182 increases the operating voltage $V_{OP}$ by a prescribed voltage $\Delta V$. When the comparison result indicates an abnormal operation (NG), the adjustment circuit 182 decreases the operating voltage $V_{OP}$ by a prescribed voltage $\Delta V$. By such a feedback-control, the adjustment circuit 182 detects the minimum voltage required for the target circuit 10 to be operable with respect to the frequency of the clock CLK. The adjustment circuit 182 detects the minimum voltage with respect to at least two frequencies of the clock CLK in this manner. Thus, the adjustment circuit 182 can detect the characteristic of the target circuit 10.

Next, the adjustment circuit 182 adjusts the slope and offset amount of the input and output characteristic of the frequency-voltage conversion circuit 21a so that the voltage $IV_{dd}$ output from the frequency-voltage conversion circuit 21a at the frequency of the clock CLK substantially matches the minimum voltage required for the target circuit 10 to be operable at the frequency of the clock CLK. A method for adjusting the slope and offset amount of the input and output characteristic of the frequency-voltage conversion circuit 21a is similar to the method described with reference to FIG. 25.

Alternatively, the adjustment circuit 182 can adjust the slope and offset amount of the input and output characteristic of the frequency-voltage conversion circuit 21a by adjusting the stage number of the delay units included in the delay circuit as described in the first example. Still alternatively, the adjustment circuit 182 can combine the adjustment of the pulse width Pw of the input pulse signal P1 and the adjustment of the stage number of the delay units included in the delay circuit.

The present invention has been described by way of preferable examples thereof. However, the above-described examples are not intended to limit the scope of the invention. Those skilled in the art would understand that modifications and alterations of the above-described examples are possible. Such modifications and alterations should be construed as being included in the scope of the present invention.

INDUSTRIAL APPLICABILITY

According to a frequency-voltage conversion circuit of the present invention, the input and output characteristic of the frequency-voltage conversion circuit is adjustable so as to adapt to the characteristic of a target circuit. Thus, an appropriate voltage can be supplied to any target circuit.

According to a system including a frequency-voltage conversion circuit of the present invention, a minimum operating voltage required for a target circuit to normally operate can be supplied. Thus, wasteful power consumption is reduced.

According to a method and apparatus for adjusting the input and output characteristic of a frequency-voltage conversion circuit of the present invention, the input and output characteristic of the frequency-voltage conversion circuit can be adjusted so as to adapt to the characteristic of a target circuit. Thus, an appropriate voltage can be supplied to any target circuit.

According to a delay amount determination circuit of the present invention, it can be determined whether or not an actual delay amount is larger than a desired delay amount with a simple structure. Such a delay amount determination circuit is suitable for use in a frequency-voltage conversion circuit.

What is claimed is:

1. A frequency-voltage conversion circuit, comprising:
   an input pulse signal generation circuit for receiving a clock pulse signal having a frequency of a clock and generating an input pulse signal having a pulse width representing a target delay amount in accordance with the frequency of the clock, the input pulse signal being different from the clock pulse signal;
   a delay circuit for delaying the input pulse signal, the delay circuit outputting a pulse signal obtained by delaying the input pulse signal as an output pulse signal; and
   a delay amount-voltage conversion circuit for outputting a voltage corresponding to the target delay amount based on a delay amount of the output pulse signal with respect to the input pulse signal and supplying the voltage to the delay circuit;
   wherein the delay circuit controls the delay amount via delay control signals received from external terminals, in accordance with the voltage which is output from the delay amount-voltage conversion circuit, and
   the voltage output from the delay amount-voltage conversion circuit is such that the voltage substantially matches a minimum voltage required for external circuitry to be operable at the frequency of the clock.

2. A frequency-voltage conversion circuit according to claim 1, wherein the input pulse signal generation circuit intermittently generates, in accordance with the clock pulse signal, the input pulse signals.

3. A frequency-voltage conversion circuit according to claim 2, wherein the clock pulse signal by which the input pulse signals are intermittently generated is variable.

4. A frequency-voltage conversion circuit according to claim 1, wherein the input pulse signal generation circuit stops generation of the input pulse signal in a predetermined mode.

5. A frequency-voltage conversion circuit according to claim 1, wherein the delay circuit is configured to allow a delay time period—power supply voltage characteristic of the delay circuit to be adjustable.

6. A frequency-voltage conversion circuit according to claim 1, wherein the delay circuit is configured to allow a slope and an offset amount of a delay time period—power supply voltage characteristic of the delay circuit to be adjustable.

7. A frequency-voltage conversion circuit according to claim 1, wherein the delay circuit includes a first delay block which operates in accordance with the voltage which is output from the delay amount-voltage conversion circuit, the first delay block includes a plurality of first delay units, and a number of the first delay units, among the plurality of first delay units through which the input pulse signal passes, is adjusted in accordance with a first delay control signal.

8. A frequency-voltage conversion circuit according to claim 7, wherein the delay circuit further includes a second delay block which operates in accordance with a prescribed fixed voltage, the second delay block includes a plurality of second delay units, and a number of the second delay units, among the plurality of second delay units through which the input pulse signal passes, is adjusted in accordance with a second delay control signal.

9. A frequency-voltage conversion circuit according to claim 1, wherein the pulse width of the input pulse signal is determined as a function of the frequency of the clock.

10. A frequency-voltage conversion circuit according to claim 9, wherein the function is represented by Pw=α/f+β, where Pw is the pulse width of the input pulse signal, f is the frequency f the clock, and α and β are constants.

11. A frequency-voltage conversion circuit according to claim 1, wherein the delay amount-voltage conversion circuit feedback-controls the voltage which is output from the delay amount-voltage conversion circuit so as to increase the output voltage which is output from the delay amount-voltage conversion circuit when the delay amount of the output pulse signal with respect to the input pulse signal is larger than the target delay amount and decrease the output voltage which is output from the delay amount-voltage conversion circuit when the delay amount of the output pulse signal with respect to the input pulse signal is smaller than the target delay amount.

12. A frequency-voltage conversion circuit according to claim 1, wherein the delay amount-voltage conversion circuit includes:
  a determination circuit for determining whether or not the delay amount of the output pulse signal with respect to the input pulse signal is larger than the target delay mount and outputting a determination signal indicating the determination result; and
  a voltage selection circuit for selectively outputting one of a plurality of voltages in accordance with the determination result.

13. A frequency-voltage conversion circuit according to claim 12, wherein the voltage selection circuit includes:
  a bidirectional shift control circuit for shifting data specifying one voltage to be selected amount the plurality of voltages in a direction corresponding to the determination signal; and
  a switch circuit for selecting one of the plurality of voltages based on the data.

14. A frequency-voltage conversion circuit according to claim 12, wherein the voltage selection circuit outputs the highest voltage among the plurality of voltages as an initial output voltage.

15. A frequency-voltage conversion circuit according to claim 12, wherein the voltage selection circuit includes a resistor, one end of the resistor is connected to a high potential, the other end of the resistor is connected to a low potential, and the plurality of voltages are obtained by dividing the resistor.

16. A frequency-voltage conversion circuit according to claim 15, wherein the voltage selection circuit further includes a switch connected to the resistor in series, and the switch is turned off in a specific mode.

17. A frequency-voltage conversion circuit according to claim 13, wherein:
  the bidirectional shift control circuit includes a plurality of stages of units, and each of the plurality of stages of units includes a memory circuit storing the data and a 2-input, 1-output selector,
  an output of the selector included in a specific-stage unit among the plurality of stages of units is connected to the memory circuit,
  an input of the selector included in the specific-stage unit among the plurality of stages of units is connected to the memory circuit included in the unit immediately previous to the specific-stage unit and the memory circuit included in the unit immediately subsequent to the specific-stage unit, and
  the selector included in each of the plurality of stages of units is controlled by the determination signal.

18. A frequency-voltage conversion circuit according to claim 17, wherein the bidirectional shift control means further includes:
  means for preventing deletion of the data stored in the memory circuit included in the frontmost-stage unit among the plurality of stages of units; and
  means for preventing deletion of the data stored in the memory circuit included in the rearmost-stage unit among the plurality of stages of units.

19. A frequency-voltage conversion circuit according to claim 1, wherein:
  the delay amount-voltage conversion circuit further includes means for storing the output voltage immediately previous to a present output voltage, and
  the delay amount-voltage conversion circuit outputs the present voltage as a first output voltage and outputs one of the present voltage or the output voltage immediately previous to the present output voltage as a second output voltage, and the first output voltage is supplied to the delay circuit.

20. A frequency-voltage conversion circuit according to claim 1, wherein:
  the delay amount-voltage conversion circuit further includes means for storing an initial output voltage.
  the delay amount-voltage conversion circuit outputs the present voltage as a first output voltage and outputs the initial output voltage as a second output voltage, and the first output voltage is supplied to the delay circuit, and
  the initial output voltage is updated to the present output voltage when the present output voltage is increased.

21. A delay amount determination circuit, comprising:
an input pulse signal generation circuit for receiving a clock pulse signal having a frequency of a clock and generating an input pulse signal having a pulse width representing a target delay amount in accordance with the frequency of the clock, the input pulse signal being different from the clock pulse signal;
a delay circuit for delaying the input pulse signal, the delay circuit outputting a pulse signal obtained by delaying the input pulse signal as an output pulse signal; and
a determination circuit for determining whether or not the delay amount of the output pulse signal with respect to the input pulse signal is larger than the target delay amount and outputting a determination signal indicating the determination result.

22. A delay amount determination circuit according to claim 21, wherein the pulse width of the input pulse signal is variably adjustable.

23. A delay amount determination circuit according to claim 21, wherein the determination circuit includes a data latch circuit receiving the input pulse signal as a clock input and the output pulse signal as a data input, and an output from the data latch circuit is output as the determination signal.

24. A system comprising a target circuit which operates in accordance with a clock and a power management circuit for supplying a minimum voltage required for the target circuit to be operable in accordance with a frequency of the clock, wherein:
the power management circuit includes a frequency-voltage conversion circuit,
the power management circuit supplies the voltage which is output from the frequency-voltage conversion circuit as the minimum voltage,
the frequency-voltage conversion circuit includes:
an input pulse signal generation circuit for receiving a clock pulse signal having a frequency of a clock and generating an input pulse signal having a pulse width representing a target delay amount in accordance with the frequency of the clock, the input pulse signal being different from the clock pulse signal;
a delay circuit for delaying the input pulse signal, the delay circuit outputting a pulse signal obtained by delaying the input pulse signal as an output pulse signal; and
a delay amount-voltage conversion circuit for outputting a voltage corresponding to the target delay amount based on a delay amount of the output pulse signal with respect to the input pulse signal and supplying the voltage to the delay circuit,
wherein the delay circuit controls the delay amount via delay control signals received from external terminals, in accordance with the voltage which is output from the delay amount-voltage conversion circuit, and
the voltage output from the delay amount-voltage conversion circuit is such that the voltage substantially matches a minimum voltage required for external circuitry to be operable at the frequency of the clock.

25. A system according to claim 24, wherein the system is formed on a single semiconductor chip.

26. A system according to claim 24, wherein the power management circuit further includes voltage conversion means for converting a given power supply voltage into the voltage which is output from the frequency-voltage conversion circuit, and the power management circuit provides the target circuit with an output from the voltage conversion means as the minimum voltage.

27. A system including a target circuit which operates in accordance with a clock and a frequency-voltage conversion circuit for receiving the clock as an input and providing a voltage in accordance with a frequency of the clock as an operating voltage for the target circuit, the system being characterized in that an input and output characteristic of the frequency-voltage conversion circuit is adjustable so that the voltage which is output from the frequency-voltage conversion circuit substantially matches a minimum voltage required for the target circuit to be operable at the frequency of the clock.

28. A system according to claim 27, wherein the target circuit has a plurality of different delay time period—power supply voltage characteristics, and the input and output characteristic of the frequency-voltage conversion circuit is adjusted based on a delay time period—power supply voltage characteristic which is obtained by synthesizing the plurality of different delay time period—power supply voltage characteristics.

29. A system according to claim 28, wherein the frequency-voltage conversion circuit has a plurality of delay circuits corresponding to the plurality of different delay time period—power supply voltage characteristics, and each of the plurality of delay circuits is configured to allow the delay time period—power supply voltage characteristic to be adjustable.

30. A system according to claim 27, wherein the frequency-voltage conversion circuit is configured so that a slope and an offset amount of the input and output characteristic of the frequency-voltage conversion circuit are adjustable.

31. In a system including a target circuit which operates in accordance with a clock and a frequency-voltage conversion circuit for receiving the clock as an input and providing a voltage in accordance with a frequency of the clock as an operating voltage for the target circuit, the method for adjusting an input and output characteristic of the frequency-voltage conversion circuit, comprising the steps of:
adjusting a slope of the input and output characteristic of the frequency-voltage conversion circuit based on the operating voltage for the target circuit measured with respect to a plurality of frequencies of the clock; and
adjusting an offset amount of the input and output characteristic of the frequency-voltage conversion circuit so that the target circuit is operable within a prescribed frequency range of the clock.

32. A method according to claim 31, wherein:
the frequency-voltage conversion circuit includes an input pulse signal generation circuit for generating an input pulse signal having a pulse width representing a target delay amount in accordance with the frequency of the clock; a delay circuit for delaying the input pulse signal, the delay circuit outputting a pulse signal obtained by delaying the input pulse signal as an output pulse signal; and a delay amount-voltage conversion circuit for outputting a voltage corresponding to the target delay amount based on the delay amount of the output pulse signal with respect to the input pulse signal and supplying the voltage to the delay circuit; the delay circuit delaying the input pulse signal in accordance with the voltage which is output from the delay amount-voltage conversion circuit,
the slope of the input and output characteristic of the frequency-voltage conversion circuit is adjusted by adjusting a slope of a delay time period—power supply voltage characteristic of the delay circuit, and the offset amount of the input and output characteristic of the frequency-voltage conversion circuit is adjusted by adjusting an offset amount of the delay time period—power supply voltage characteristic of the delay circuit.

33. A method according to claim 32, wherein:

the delay circuit includes a first delay block which operates in accordance with the voltage which is output from the delay amount-voltage conversion circuit and a second delay block which operates in accordance with a prescribed fixed voltage, the first delay block includes a plurality of first delay units, and the second delay block includes a plurality of second delay units, a slope of the delay time period—power supply voltage characteristic of the delay circuit is adjusted by adjusting a stage number of the first delay units, among the plurality of first delay unit through which the input pulse signal passes, and an offset amount of the delay time period—power supply voltage characteristic of the delay circuit is adjusted by adjusting a stage number of the second delay units, among the plurality of second delay units through which the input pulse signal passes.

34. A method according to claim 31, wherein:

the frequency-voltage conversion circuit includes an input pulse signal generation circuit for generating an input pulse signal having a pulse width representing a target delay amount in accordance with the frequency of the clock; a delay circuit for delaying the input pulse signal, the delay circuit outputting a pulse signal obtained by delaying the input pulse signal as an output pulse signal; and a delay amount-voltage conversion circuit for outputting a voltage corresponding to the target delay amount based on the delay amount of the output pulse signal with respect to the input pulse signal and supplying the voltage to the delay circuit; the delay circuit delaying the input pulse signal in accordance with the voltage which is output from the delay amount-voltage conversion circuit, and the slope and the offset amount of the input and output characteristic of the frequency-voltage conversion circuit are adjusted by adjusting the pulse width of the input pulse signal as a function of the frequency of the clock.

35. A method according to claim 34, wherein:

the function is represented by $Pw=\alpha/f+\beta$, where Pw is the pulse width of the input pulse signal, f is the frequency of the clock, and $\alpha$ and $\beta$ are constants, the slope of the input and output characteristic of the frequency-voltage conversion circuit is adjusted by adjusting a value of $\alpha$, and the offset amount of the input and output characteristic of the frequency-voltage conversion circuit is adjusted by adjusting a value of $\beta$.

36. In a system including a target circuit which operates in accordance with a clock and a frequency-voltage conversion circuit for receiving the clock as an input and providing a voltage in accordance with a frequency of the clock as an operating voltage for the target circuit, the apparatus for automatically adjusting an input and output relationship of the frequency-voltage conversion circuit, comprising:

self-diagnosis means for determining whether or not the target circuit normally operates in the relationship between the operating voltage and the frequency of the clock; and adjusting means for adjusting the input and output in the relationship of the frequency-voltage conversion circuit based on the determination result of the self-diagnosis means.

37. An apparatus according to claim 36, wherein the self-diagnosis means includes:

operating means for operating the target circuit with respect to an input vector for realizing a maximum delay path of the target circuit; and comparison means for comparing an output from the target circuit with respect to the input vector with a prescribed expected value with respect to the input vector.

38. An apparatus according to claim 36, wherein the adjustment means includes:

means for adjusting a slope of an input and output characteristic of the frequency-voltage conversion circuit; and means for adjusting an offset amount of the input and output characteristic of the frequency-voltage conversion circuit.

39. An apparatus according to claim 36, wherein the apparatus and the system are formed on a single semiconductor chip.

* * * * *